(12) United States Patent
Chang et al.

(10) Patent No.: US 12,046,480 B2
(45) Date of Patent: Jul. 23, 2024

(54) MANUFACTURING METHOD OF A SEMICONDUCTOR DEVICE

(71) Applicant: TAIWAN SEMICONDUCTOR MANUFACTURING COMPANY LTD., Hsinchu (TW)

(72) Inventors: Shou Zen Chang, Taipei County (TW); Chun-Lin Lu, Hsinchu (TW); Kai-Chiang Wu, Hsinchu (TW); Ching-Feng Yang, Taipei (TW); Vincent Chen, Taipei (TW); Chuei-Tang Wang, Taichung (TW); Yen-Ping Wang, Changhua County (TW); Hsien-Wei Chen, Hsinchu (TW); Wei-Ting Lin, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 602 days.

(21) Appl. No.: 16/940,264

(22) Filed: Jul. 27, 2020

(65) Prior Publication Data

US 2020/0357659 A1    Nov. 12, 2020

Related U.S. Application Data

(62) Division of application No. 14/839,047, filed on Aug. 28, 2015, now Pat. No. 10,727,082.

(51) Int. Cl.
*H01L 21/48* (2006.01)
*H01L 21/56* (2006.01)
(Continued)

(52) U.S. Cl.
CPC ........ *H01L 21/486* (2013.01); *H01L 21/4853* (2013.01); *H01L 21/561* (2013.01);
(Continued)

(58) Field of Classification Search
CPC ..................................... H01L 24/19
See application file for complete search history.

(56) References Cited

U.S. PATENT DOCUMENTS 9,640,531 B1 *   5/2017   Or-Bach ............. H01L 27/1203
2010/0276792 A1 * 11/2010   Chi ..................... H01L 23/3128
                                                         257/E23.116
(Continued)

*Primary Examiner* — Moazzam Hossain
*Assistant Examiner* — Hajar Kolahdouzan
(74) *Attorney, Agent, or Firm* — WPAT LAW; Anthony King

(57) ABSTRACT

A method of manufacturing a semiconductor device includes providing a semiconductor die and surrounding a sidewall of the semiconductor die with a dielectric material. The method further includes forming a post passivation interconnect (PPI) over the semiconductor die and electrically coupling the PPI with the semiconductor die. The method further includes molding the semiconductor die and the PPI into an integrated semiconductor package. The method further includes covering at least a portion of an outer surface of the integrated semiconductor package with a conductive layer, wherein the conductive layer is conformal to the morphology of the portion of the outer surface. Moreover, the method further includes forming a conductive path inside the integrated semiconductor package electrically coupled to the conductive layer and a ground terminal of the integrated semiconductor package.

20 Claims, 37 Drawing Sheets

(51) Int. Cl.
  *H01L 21/78*     (2006.01)
  *H01L 23/00*     (2006.01)
  *H01L 23/31*     (2006.01)
  *H01L 23/498*    (2006.01)
  *H01L 23/538*    (2006.01)
  *H01L 23/552*    (2006.01)

(52) U.S. Cl.
  CPC .......... *H01L 21/78* (2013.01); *H01L 23/3121* (2013.01); *H01L 23/49811* (2013.01); *H01L 23/5389* (2013.01); *H01L 23/552* (2013.01); *H01L 24/19* (2013.01); *H01L 24/97* (2013.01); *H01L 21/568* (2013.01); *H01L 23/49827* (2013.01); *H01L 23/5384* (2013.01); *H01L 23/5386* (2013.01); *H01L 2224/04105* (2013.01); *H01L 2224/73267* (2013.01); *H01L 2224/97* (2013.01); *H01L 2924/1815* (2013.01); *H01L 2924/3025* (2013.01)

(56) References Cited

U.S. PATENT DOCUMENTS

| | | | |
|---|---|---|---|
| 2015/0348936 A1* | 12/2015 | Lin | H01L 24/19 |
| | | | 257/659 |
| 2017/0103932 A1* | 4/2017 | Takemura | C23C 14/042 |
| 2017/0162550 A1* | 6/2017 | Das | H01L 23/5385 |

* cited by examiner

MANUFACTURING METHOD OF A SEMICONDUCTOR DEVICE

PRIORITY CLAIM AND CROSS-REFERENCE

This patent is a divisional application of U.S. patent application Ser. No. 14/839,047 filed on Aug. 28, 2015, entitled of "SEMICONDUCTOR DEVICE AND MANUFACTURING METHOD THREOF", which is incorporated by reference in its entirety.

BACKGROUND

Presently, the electronic equipments are indispensable from our daily life, which involve and incorporate with many electronic components. In an electronic industry, the electronic components consisting dies are widely adopted in various electronic equipments and applications. As the electronic industry progresses, a miniaturization and higher functions of the electronic components are increasingly emphasized. The demands on miniaturization and higher functions of the electronic components result in more complicated and denser configuration.

The major trend in the electronic industry is to make the electronic components lighter, smaller, more multifunctional, more powerful, more reliable and less expensive. Thus, a wafer level packaging (WLP) technology has been gaining in popularity. This technology provides a manufacturing of the electronic components at a wafer level, and is widely applied in order to meet continuous demands toward the miniaturization and higher functions of the electronic components.

As the applications and complexity of the wafer level packages increase, there are more challenges to the reliability and stability. As such, improvements in the structure and method for a WLP continue to be sought.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
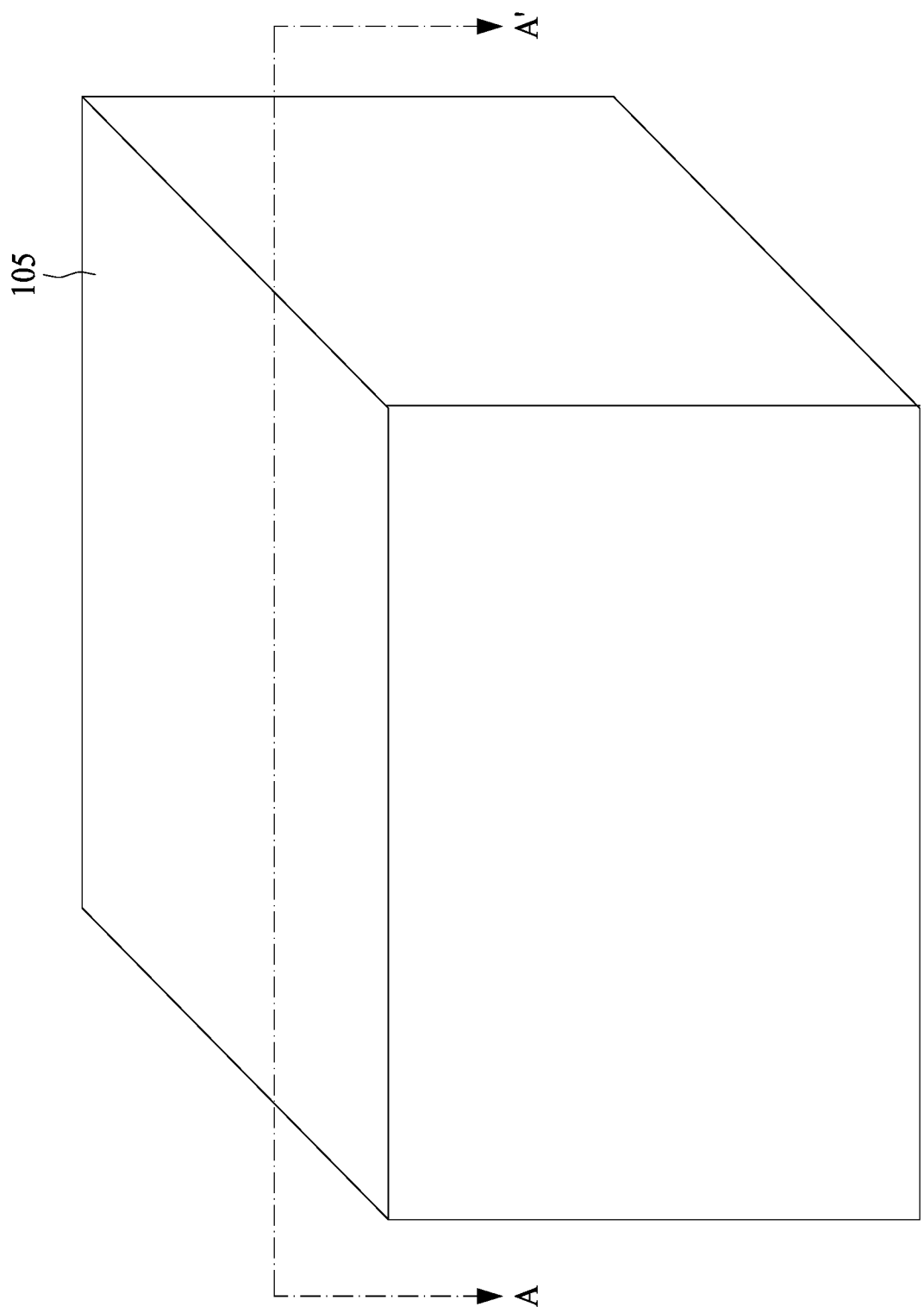
FIG. 1 is an anti-EMI semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, a semiconductor device is provided to have a shield for protecting a semiconductor component from external (Electric Magnetic Interference) disturbance. The semiconductor component is manufactured from a wafer level package by utilizing fan-in or fan-out technical operations. The shield is an outermost shell of the semiconductor device and substantially encloses the semiconductor component inside the semiconductor device. Further, the shield is also coupled to a ground terminal of the semiconductor device.

Figure 1A:
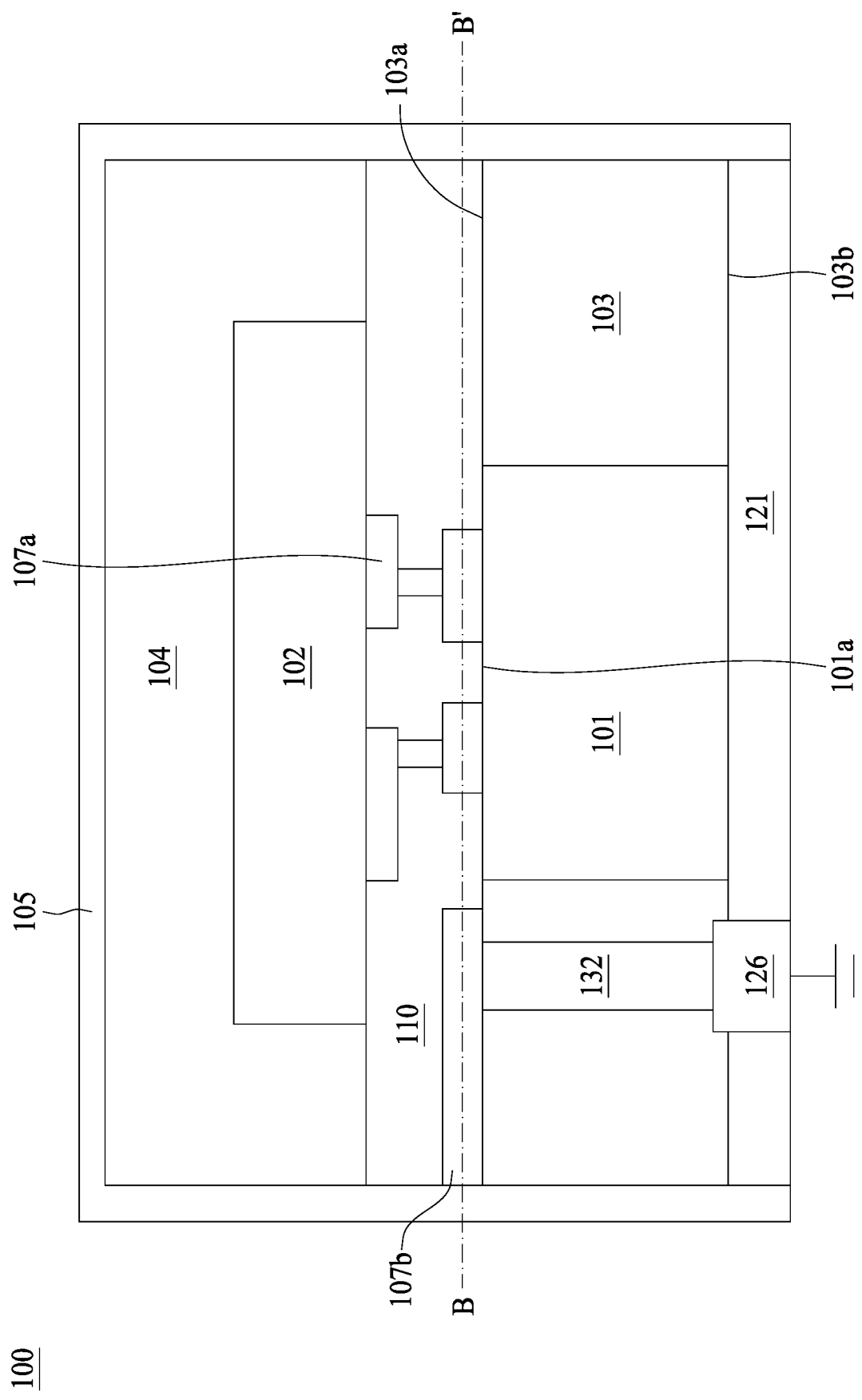
FIG. 1A is a cross sectional view along AA' in FIG. 1 in accordance with some embodiments.

In FIG.1, an anti-EMI semiconductor device 100 is illustrated. The semiconductor device 100 includes a shield 105 to cover at least one semiconductor component resided inside. The shield 105 can prevent or degrade external EM, which may bring noises to the semiconductor component. In the present disclosure, the shield 105 is opaque, thus a cross sectional view along line AA' is presented herein to help further describe the interior of the semiconductor device 100. FIG. 1A is the cross sectional view along AA'. In the semiconductor device 100, the space inside the shield 105 is substantially filled with an integrated semiconductor package which includes material such as filling and semiconductor component. The integrated semiconductor package includes a semiconductor die 101 located inside the device 100 and a substrate 121 optionally selected to support the semiconductor die 101. Sidewalls of the semiconductor die 101 are surrounded by a first level dielectric 103. A top surface 103a of the first level dielectric 103 is substantially coplanar with a top surface 101a of the semiconductor die 101. A second level 104 is over the top surface 101a of the semiconductor die 101.

A middle region 110 is sandwiched between the first level dielectric 103 and the second level 104. A portion of the middle region 110 is also between the semiconductor die 101 and the second level.

An electronic component 102 may be optionally inserted in the second level 104 and electrically coupled with the semiconductor die 101 through a conductive structure in the middle region 110. The semiconductor die 101 and electronic component 102 are integrated to perform various functions such as wireless signal transmission, processing, illuminating, etc.

The shield 105 filters out external EMI to ensure that the semiconductor device 100 can function properly. The shield 105 is conformally covering at least a portion of an outer surface of the integrated semiconductor package without any gap in between. As in FIG. 1A, the shield 105 conformally encloses sidewall and top surface of the integrated semiconductor package while leave the bottom of the semiconductor die 101 uncovered. A detachable substrate 121 is disposed under the semiconductor die 101 to seal the bottom of the integrated semiconductor package. In some embodiments, the shape of the shield 105 follows the morphology of at least a portion of an outer surface of the integrated semiconductor package.

The conductive structure inside the middle region 110 includes at least two portions of conductive structure. A first portion 107a of the conductive structure is configured to be electrically coupled with the semiconductor die 101. In some embodiment, the electronic component 102 is electrically coupled with the semiconductor die 101 through the first portion 107a. The first portion conductive trace 107a provides a communication path between active regions the semiconductor die 101 and active regions of the electronic component 102. In some embodiments, the first portion conductive trace 107a is an RIM (Redistribution Layer) or interconnection via of the integrated semiconductor package. The first portion 107a is also called active portion of the conductive structure.

A second potion 107b of the conductive structure is configured to coupling the shield 105 with ground. The second portion conductive trace 107b is not connected to any active contact of either the semiconductor die 101 or the electronic component 102. The second potion conductive trace 107b provides a discharging path between the shield 105 and ground in order to effectively reduce the noise.

In some embodiments, the second portion 107b is disposed around a region proximal to the shield 105 compared to the first portion 107a, which is disposed over the active regions of the semiconductor die 101 or the electronic component 102. As in FIG. 1a, the second portion 107b is disposed proximal to a peripheral region of the integrated semiconductor package rather than the first portion, which is disposed proximal to the central region of the integrated semiconductor package. The second portion 107b is also called dummy portion of the conductive structure.

One end of the second portion 107b is connected with the shield 105 while the other end of the second portion 107b is connected with a TIV 132 (Through Isolation Via). The ITV 132 is a conductive post or trace embedded in the first level dielectric 103. The TIV 132 is extended upwardly in a direction substantially parallel to the thickness of the semiconductor die 101. In some embodiments, the TIV 132 is extended through the thickness of the first level dielectric 103. One end of the TIV 132 is extended to the top surface 103a of the first level dielectric 103 and the other end of the TIV 132 is extended to the bottom surface 103b of the first level dielectric 103. The TIV 132 is connected with the second portion 107b of the conductive structure at the top surface 103a of the first level dielectric 103 and connected with a contact 126 at the bottom surface 103a of the first level dielectric 103. The contact 126 is designed to be coupled with ground. The second portion conductive trace 107b and TIV 132 together form a conductive path that is configured to connect the shield 105 with ground.

Figure 2:
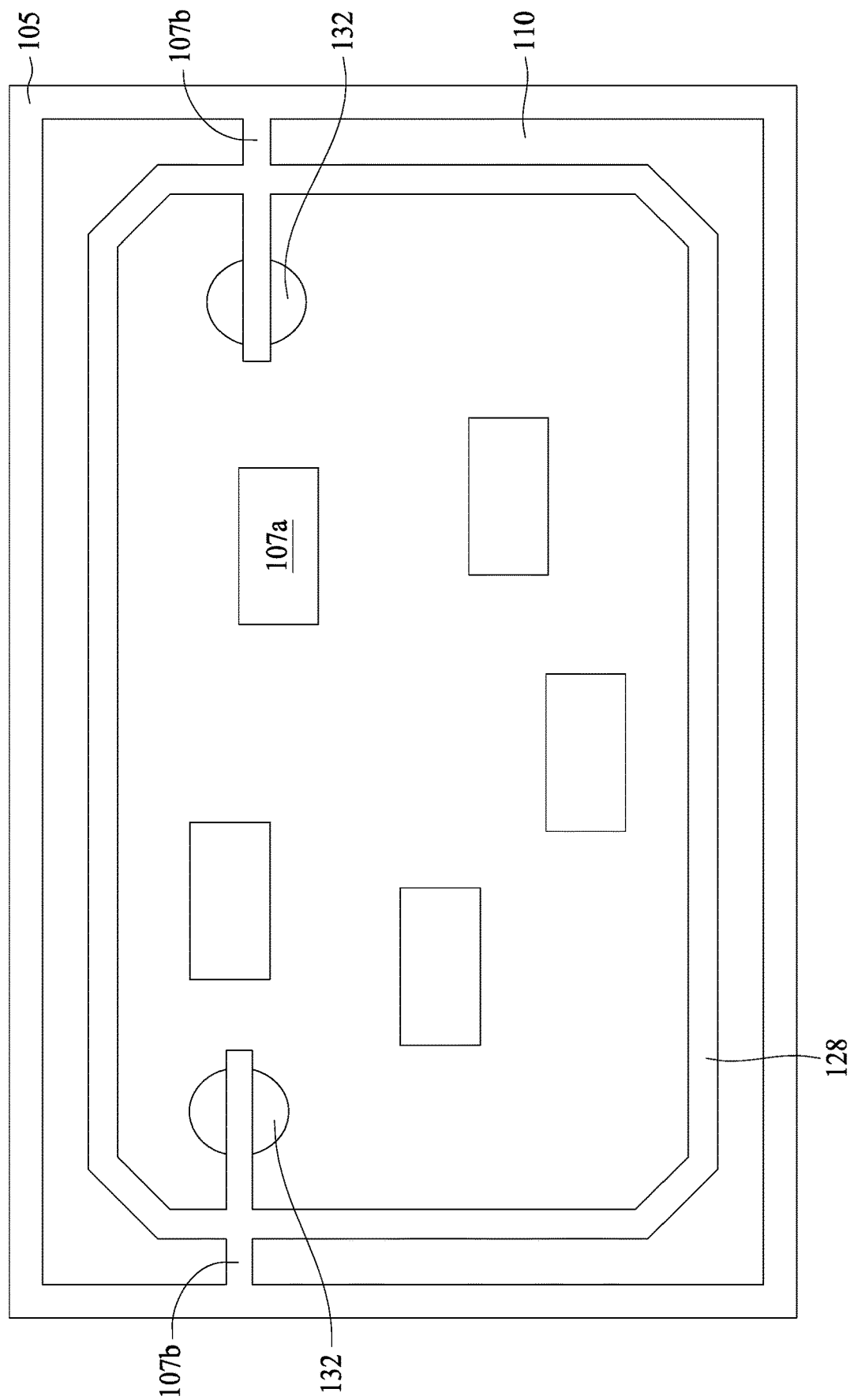
FIG. 2 is a top view of the semiconductor device along line BB' in FIG. 1A in accordance with some embodiments.

FIG. 2 is a top view of the semiconductor device along line BB'. The outer ring 105 is the shield covering the integrated semiconductor package. The area inside the shield 105 is the integrated semiconductor package. There are two sections of the second portion 107b respectively located on the left and right side. Each second portion conductive trace 107b is connected to the shield 105 at one end and connected to the TIV 132 at the other end. In the periphery of the device, a conductive seal ring 128 of the integrated semiconductor package is disposed inside the shield 105 to protect the electronic components (the die 101 and component 102 in FIG. 1a) disposed there within. Inside the seal ring 128, there are several conductive blocks, which are the first portion conductive trace 107a, arranged as interconnection for the electronic components disposed in the integrated semiconductor package. The seal ring 128 is electrically coupled to the shield 105 through the second portion conductive trace 107b. In other words, the seal ring 128 is a portion of the path that connects the shield 105 to the ground. In some embodiments, the seal ring 128 is a multi-level structure and includes more than one level of conductive features with dielectric inserted between different levels of conductive features.

In some embodiments, the middle region 110 may be more complex. As in FIG. 3, there is a three leveled conductive structure in the middle region 110. Each level respectively has a first portion conductive trace 107a configured as interconnection between the die 101 and component 102 and a second portion conductive trace 107b configured as a portion of ground path to be connected with the shield 105. The second portions located in different level are connected by at least one interconnection via 107c. The first level conductive trace 107b-1 is connected to the shield 105 at one end and connected with a first TIV 132a at the other end. The first TIV 132a is further extended to the bottom surface 103b and coupled with the ground contact 136. The second level conductive trace 107b-2 is connected to the shield 105 at one end and connected to an interconnection via 107c-1 at the other end. The interconnection via 107c-1 is further extended to be connected with a portion of the first level conductive trace 107b-1, and coupled with the ground contact 136 through a TIV 132b. The third level conductive trace 107b-3 is connected to the shield 105 at one end and connected to an interconnection via 107c-2 at the other end. The interconnection via 107c-2 is extended in the dielectric portion of the middle region 110 and further connected with the second level conductive trace 107b-2. The multi-level conductive structure 107 provides more contacts to the shield 105 so the charges on the shield can be conducted to gourd contact 136 through several different paths.

Figure 4:
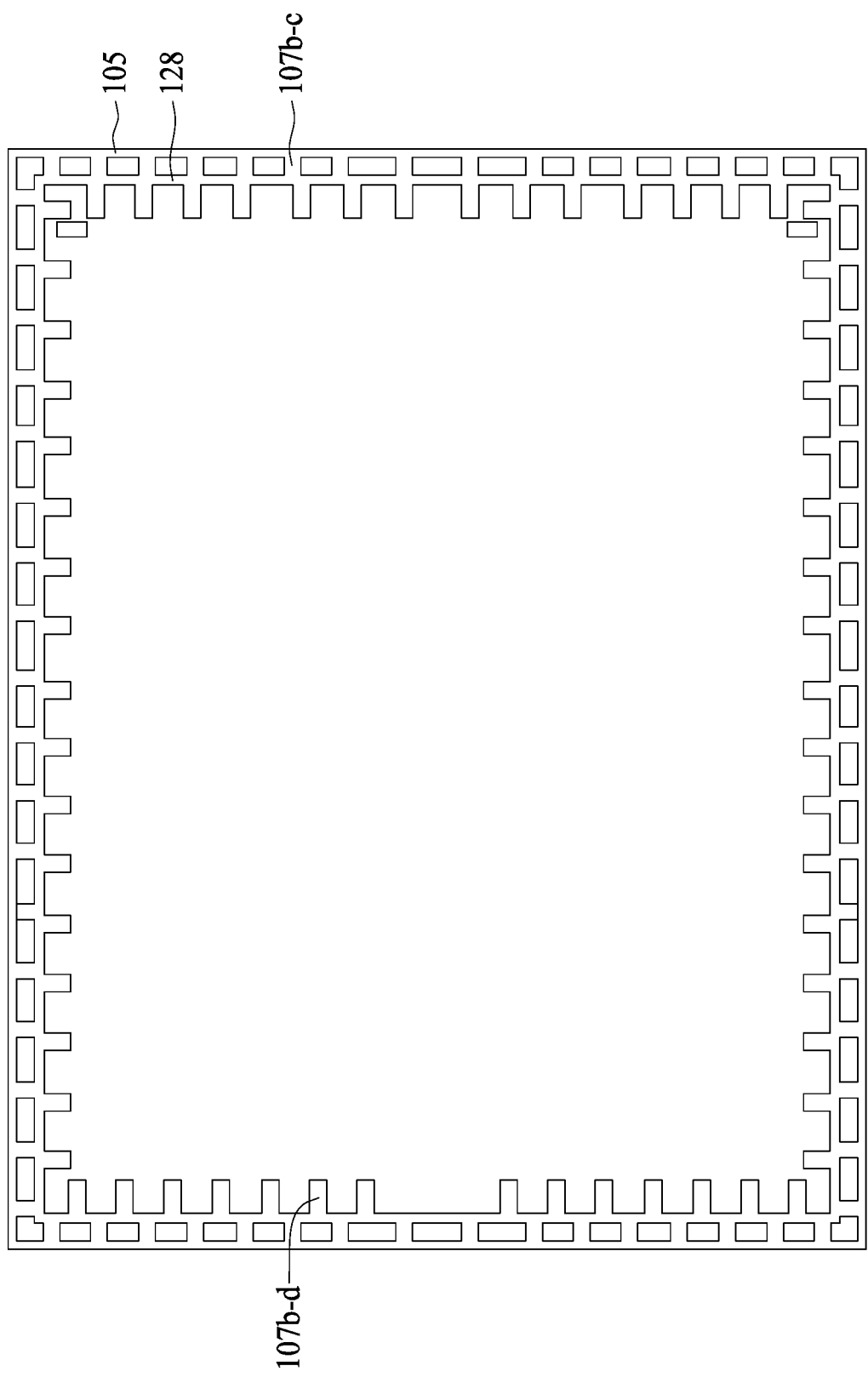
FIG. 4 is a top view of an anti-EMI semiconductor device in accordance with some embodiments.

The conductive trace structure can be arranged in various patterns. FIG. 4 is a top view of a shield 105 connected with a conductive trace structure in the middle region. The integrated semiconductor package is the area enclosed by the shield 105. A seal ring 128 of the integrated semiconductor package is coupled with the shield 105 through several conductive traces 107b-c (for simplification, portion 107a is ignored in the drawing). The conductive trace has other portions 107b-d further extends from the seal ring 128 toward the central region of the integrated semiconductor package. Each extension section 107b-d of the conductive trace 107b may be coupled to ground through a TIV.

Figure 3:
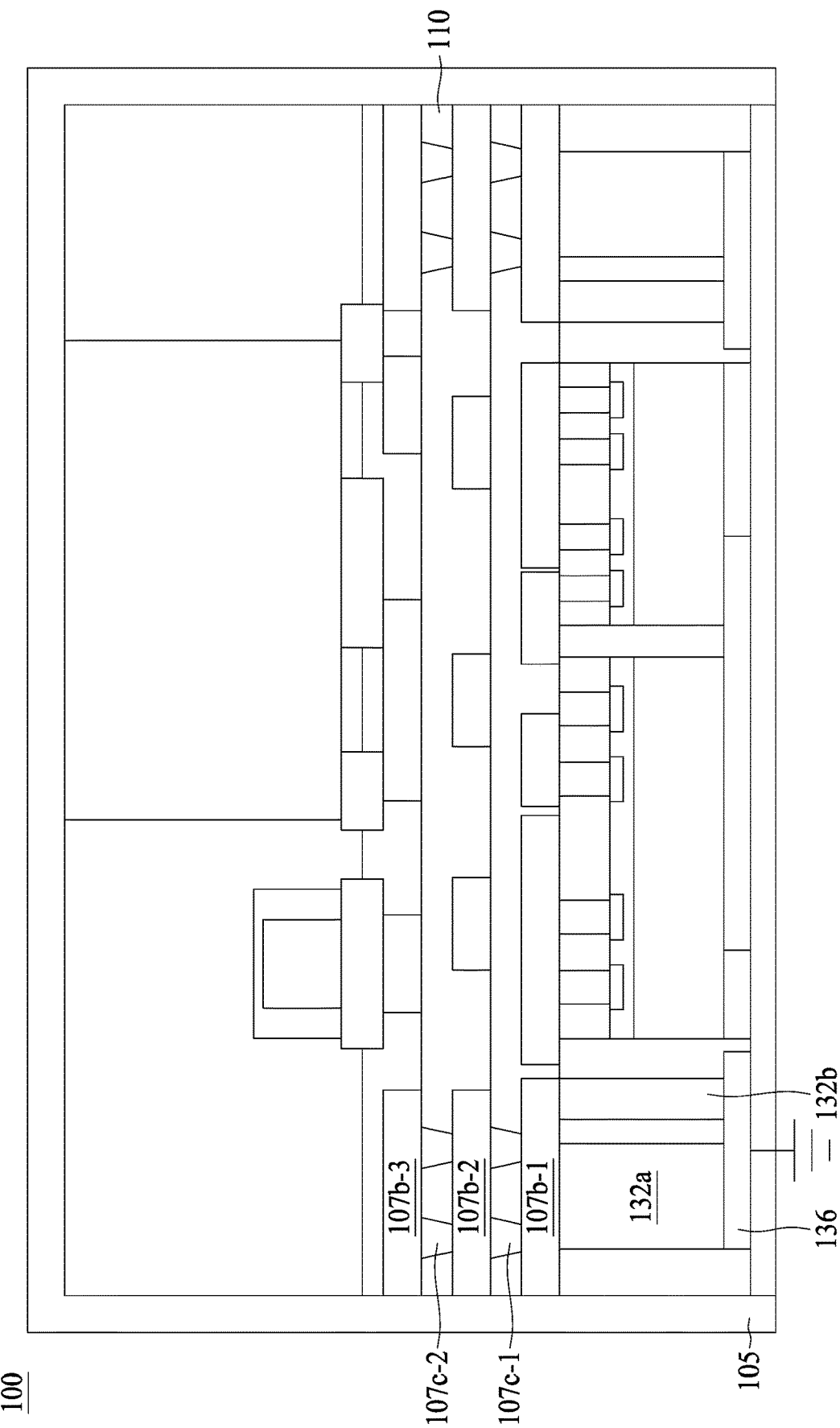
FIG. 3 is a cross sectional view of an anti-EMI semiconductor device in accordance with some embodiments.
Figure 4A:
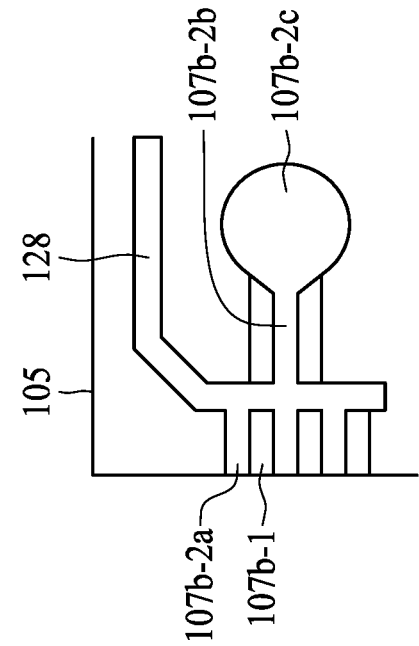
FIG. 4A is a top view of a portion of an anti-EMI semiconductor device in accordance with some embodiments.

FIG. 4A is an enlarged portion top view to illustrate a multi-level conductive structure, which includes a portion to be configured as a ground path. The dielectric between different level conductive trace is ignored in the drawing. Numerical labels in FIG. 3 are used herein for similar features. A first level conductive trace 107b-1 and a second level conductive trace 107b-2 are disposed proximal to the shield 105 wherein both are dummy portion and electrically connected to the shield 105. The first level conductive trace 107b-1 is under the second level conductive trace 107b-2 so that a portion of the first level conductive trace 107b-1 may be hidden under the second level conductive trace 107b-2. The second level conductive trace 107b-2 is designed to have a teeth portion 107b-2a and a portion 107b-2b extended toward the central region of the integrated semiconductor package. The second level conductive trace 107b-2 further has a dummy pad 107b-2c inside the seal ring 128. In some embodiments, a dummy portion in each level is formed concurrently with an active portion, which is electrically coupled with the semiconductor die 101 or the electronic component 102 as in FIG. 1. The formation operation of the shield connecting conductive trace shares a same mask as for forming the active portion.

Figure 5B:
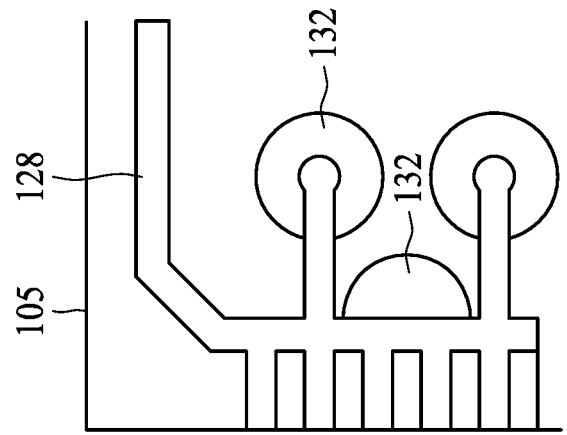
FIG. 5B is a top view of a portion of an anti-EMI semiconductor device in accordance with some embodiments.
Figure 5C:
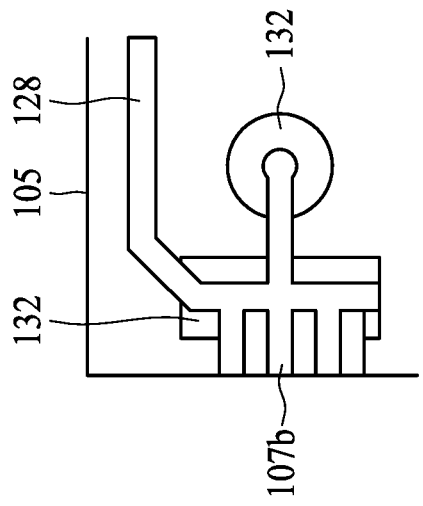
FIG. 5C is a top view of a portion of an anti-EMI semiconductor device in accordance with some embodiments.
Figure 5A:
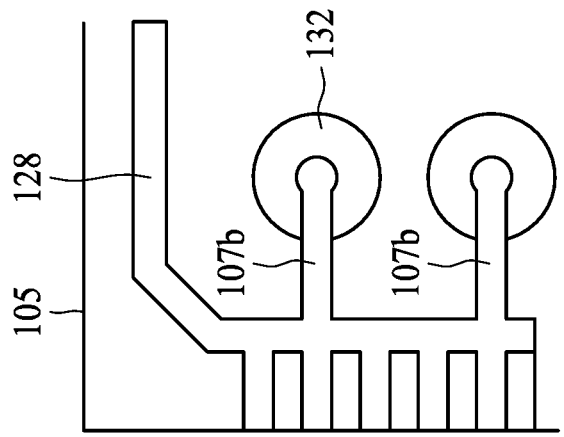
FIG. 5A is a top view of a portion of an anti-EMI semiconductor device in accordance with some embodiments.

Arrangements of TIV can vary and some of them are illustrated from FIG. 5a through FIG. 5c. In FIG. 5a, the TIV 132 are disposed within the seal ring 128 and connected with the extension portion of conductive trace 107b. On the other end opposite to the extension portion, the conductive trace 107b is further connected with the shield 105. In FIG. 5b, some TIV 132 are disposed within the seal ring 128 as the TIV in FIG. 5a, and some TIV 132 are disposed under the seal ring 128. Different TIV may form a staggered pattern such that the density of TIV 132 is increased so as to have the amount of path connected to ground contact increased. FIG. 5c is another embodiment showing a strip shape TIV 132 under the seal ring 128 and conductive trace 107b. In some embodiments, the TIV may have at least two different heights in order to be connected to conductive traces 107 located in different levels.

Figure 6:
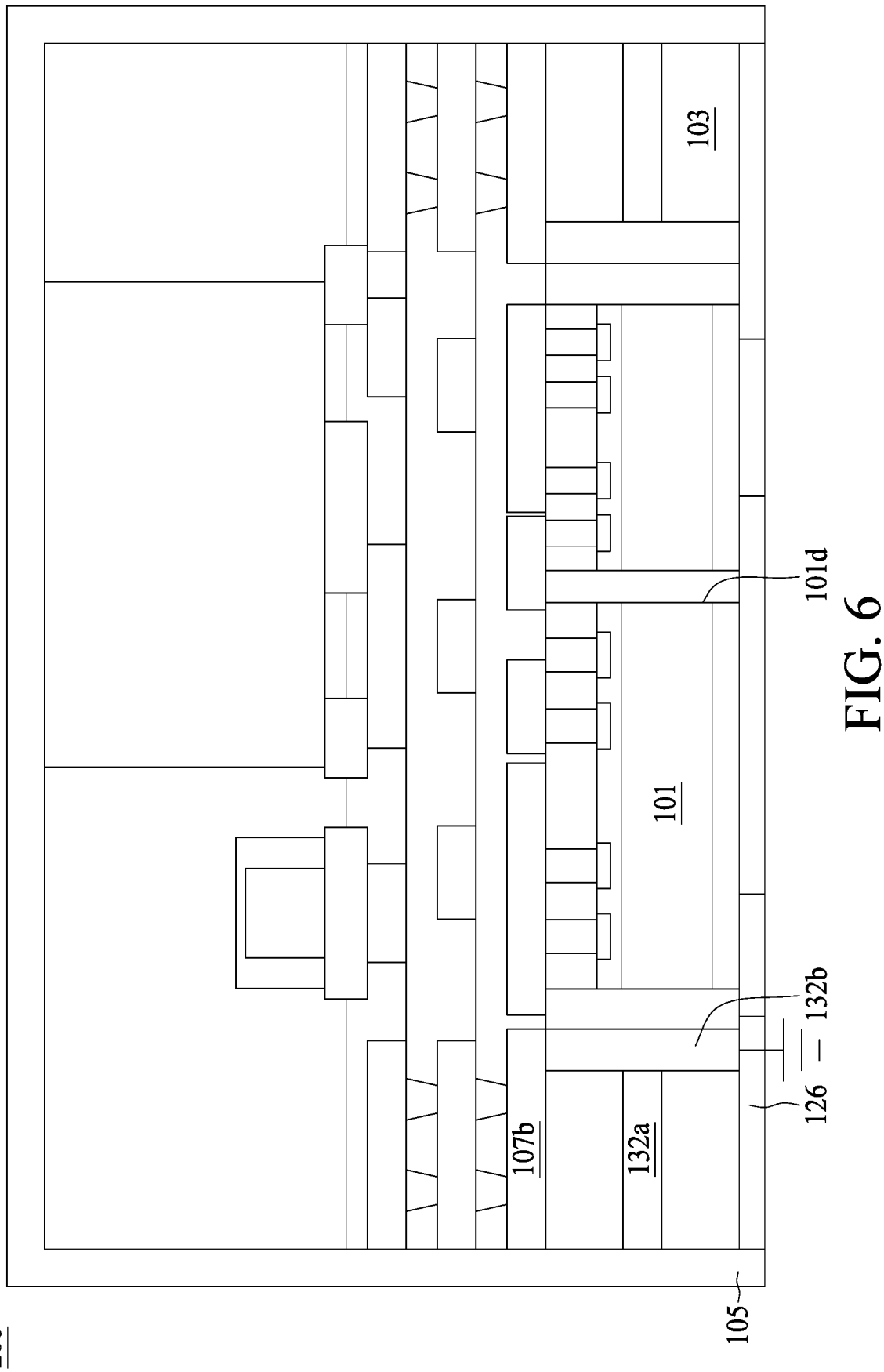
FIG. 6 is a cross sectional view of an anti-EMI semiconductor device in accordance with some embodiments.
Figure 6A:
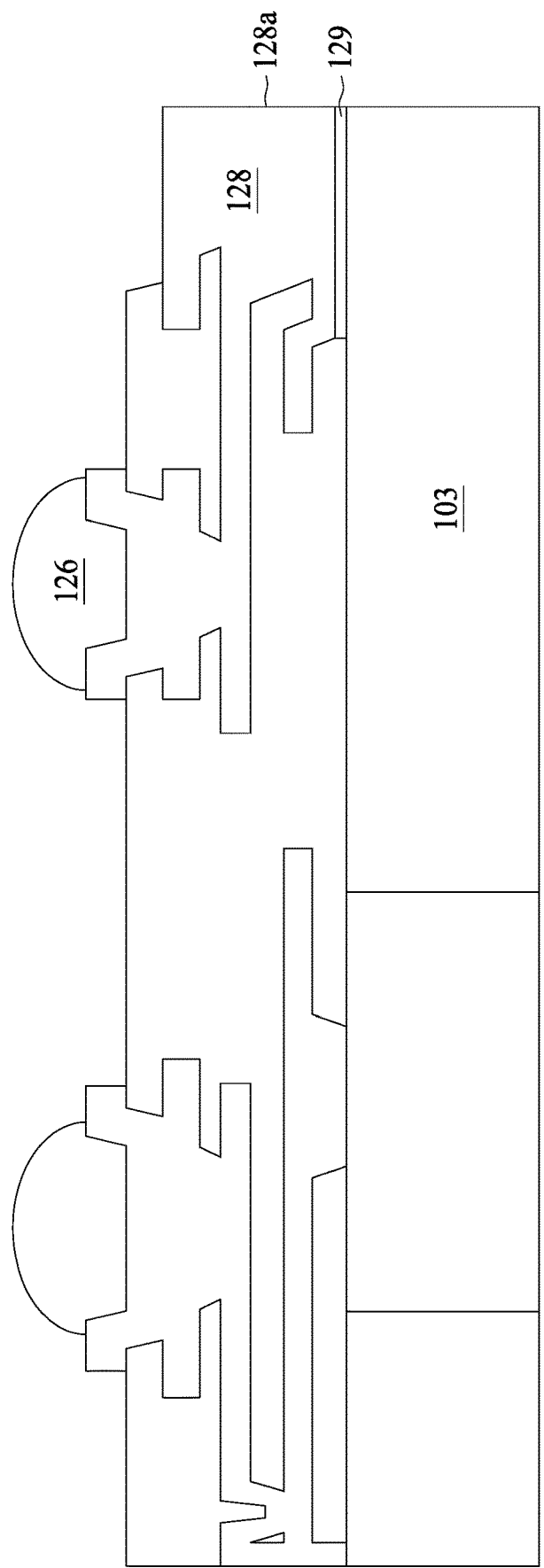
FIG. 6A to FIG. 6C are a portion of a conductive trace of a semiconductor device in accordance with some embodiments.
Figure 6B:
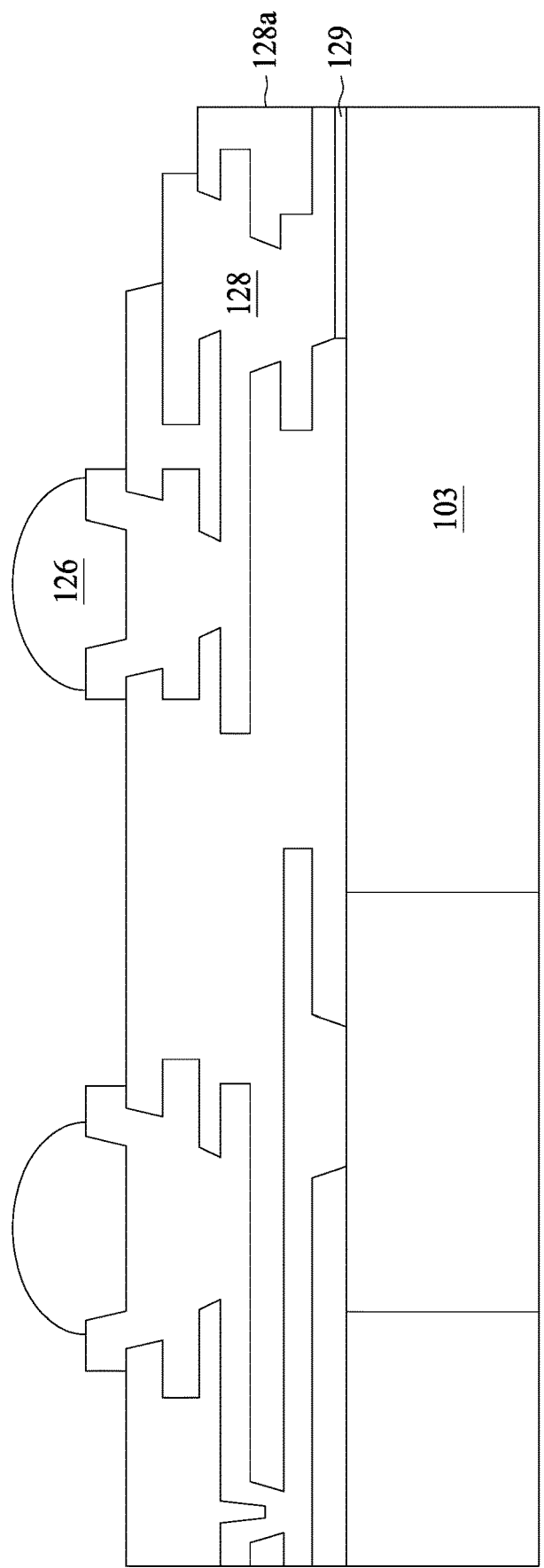
Figure 6C:
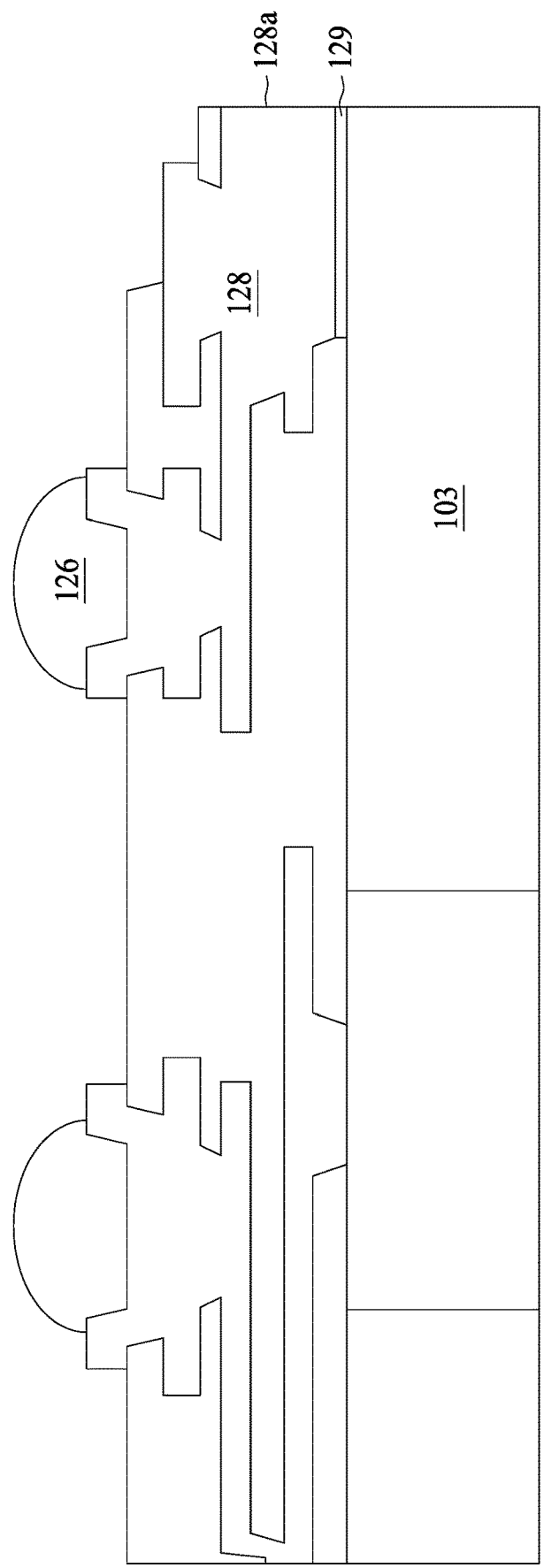

Besides laying the shield grounding path in the middle region, another approach is to design a path in or adjacent the first level dielectric. FIG. 6 is a cross sectional view of a semiconductor device 200 and same numerical labels are used for similar features or elements described in the aforementioned embodiments in the following embodiments. The semiconductor device 200 is similar to the semiconductor device 100 in FIG. 1; however, the semiconductor device 200 further includes a conductive trace 132a located in the first level dielectric 103. The conductive trace 132a is extended substantially perpendicular to the sidewall 101d of the semiconductor die 101. The conductive trace 132a is connected to a shield 105 at one end and connected to a TIV 132b at the other end. Charges on the shield 105 can flow to the ground terminal, contact 126, through a path including the conductive trace 132a and TIV 132b. The conductive trace 132a provides an additional grounding path to the shield 105 in comparison with the semiconductor device 100 in FIG. 1. In some embodiments, the conductive trace 107b in the middle region 110 can be removed, such that the shield grounding path is only disposed on the first level dielectric 103. In some embodiments, a portion of the conductive trace 107b in the middle region 110 is configured as a seal ring. FIG. 6A to FIG. 6C illustrate a portion of the conductive trace is disposed at the edge as seal ring 128. The seal ring 128 is configured to be in contact with the EMI shield at one end 128a and connected with a ground terminal 126 at the other end. The seal ring 128 may have several layers and each one of that is corresponding to an active RDL in the package. An adhesive layer 129 is optionally disposed over or contacting the first dielectric 103. The adhesive layer 129 provides a boding force to secure the seal ring 128 to be over the first dielectric 103 while any pull force applied on the seal ring 128.

Figure 7:
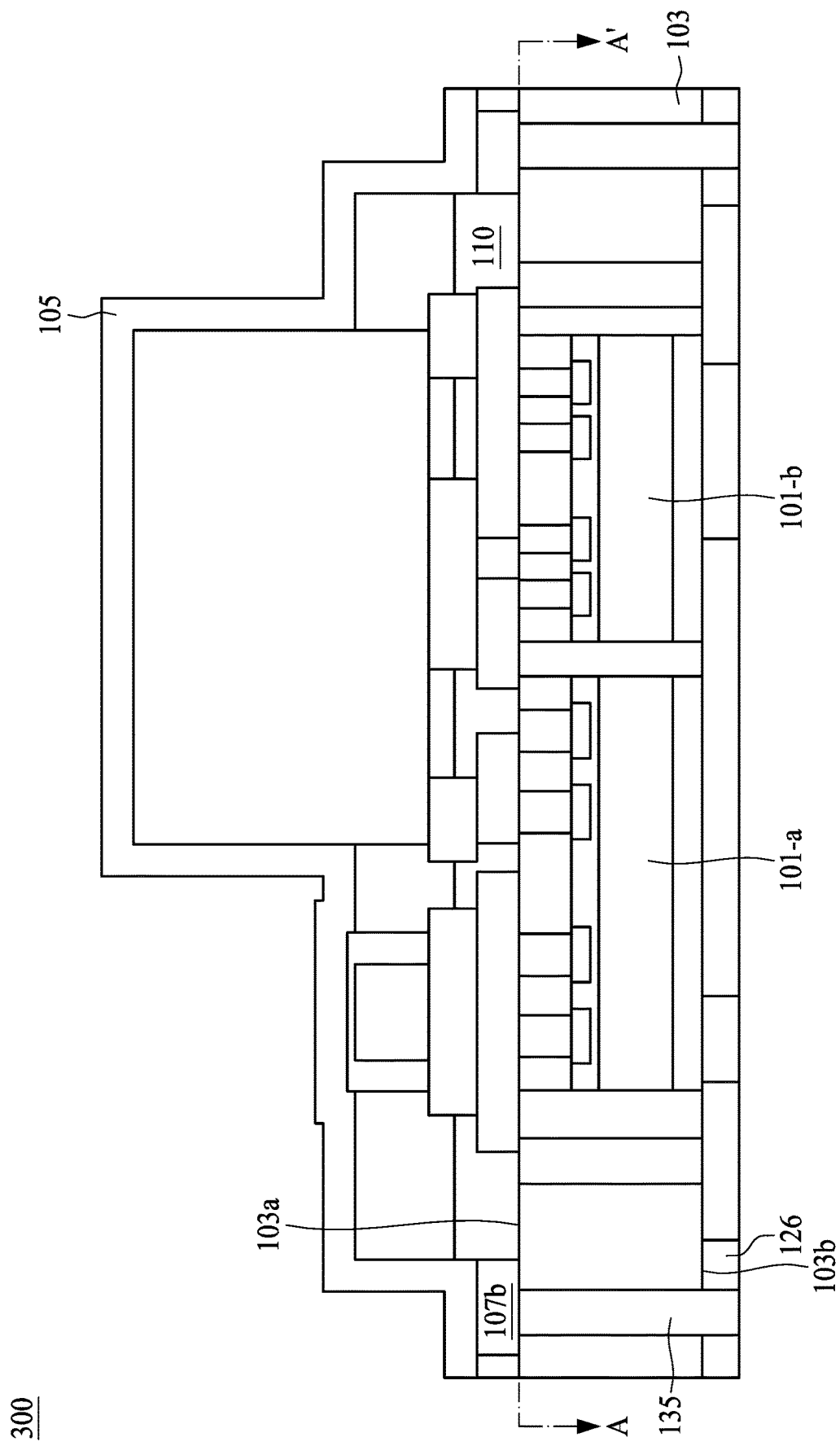
FIG. 7 is a cross sectional view of an anti-EMI semiconductor device in accordance with some embodiments.

Another embodiment of inserting the EMI shield grounding path in the first level dielectric 103 is shown in FIG. 7. In FIG. 7, a retainer 135 is disposed in the first level dielectric 103 of a semiconductor device 300. The retainer 135 is substantially located at a periphery region of the integrated semiconductor package. The retainer 135 is conductive and extended from the bottom surface 103b to the top surface 103a of the first level dielectric 103. One end of the retainer 135 is proximal to the top surface 103a and also coupled to the shield 105 of the semiconductor device 300 through direct contact (not shown) or through a dummy conductive trace 107b (as FIG. 7), which is located in the middle region 110. The other end of the retainer is proximal to the bottom surface 103b and coupled to a ground contact 126. The retainer 135 provides grounding path to the EMI shield in the first level.

Figure 7A:
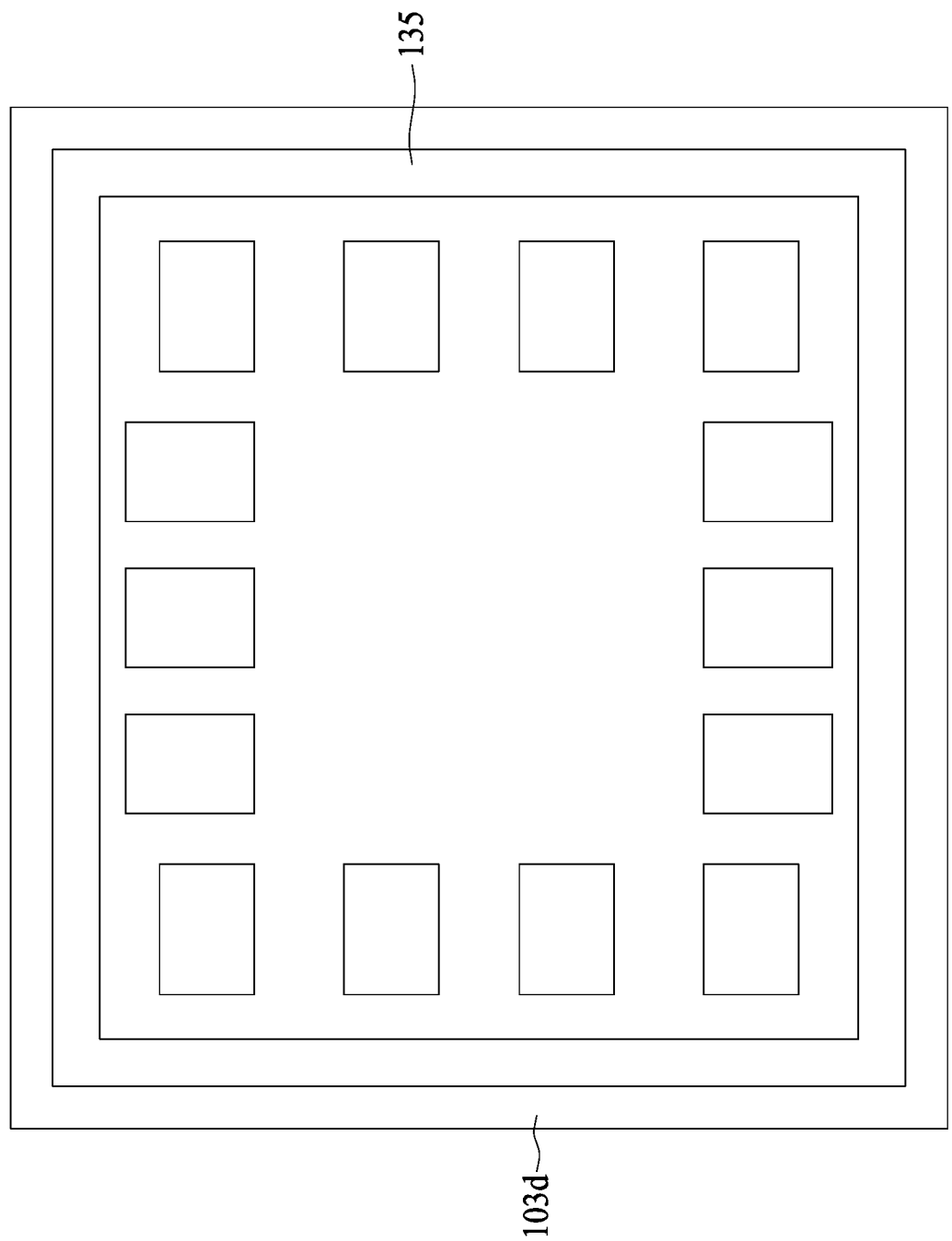
FIG. 7A is a top view an anti-EMI semiconductor device in FIG. 7 in accordance with some embodiments.

FIG. 7a is a top view along line AA' in FIG. 7. The retainer 135 is disposed proximal to the edge 103d of the first level dielectric 103. Some active conductive features (such as pad, post) coupled to the semiconductor die 101-a or 101-b are located inside the retainer 135.

In the present disclosure, a semiconductor device can include various designs of shield according to the morphology of an outer surface of the integrated semiconductor package. As the semiconductor device 100 in FIG. 1 or 6, the cross section view of the shield 105 is substantially in a quadrilateral shape. FIG. 7 is another shield configuration wherein the shield 105 is in a stepped configuration. The top of the integrated semiconductor package is not a planar surface such that the conformal shield 105 also follows the stepped configuration of the integrated semiconductor package. The semiconductor device 300 has more than six outer surfaces.

Figure 8A:
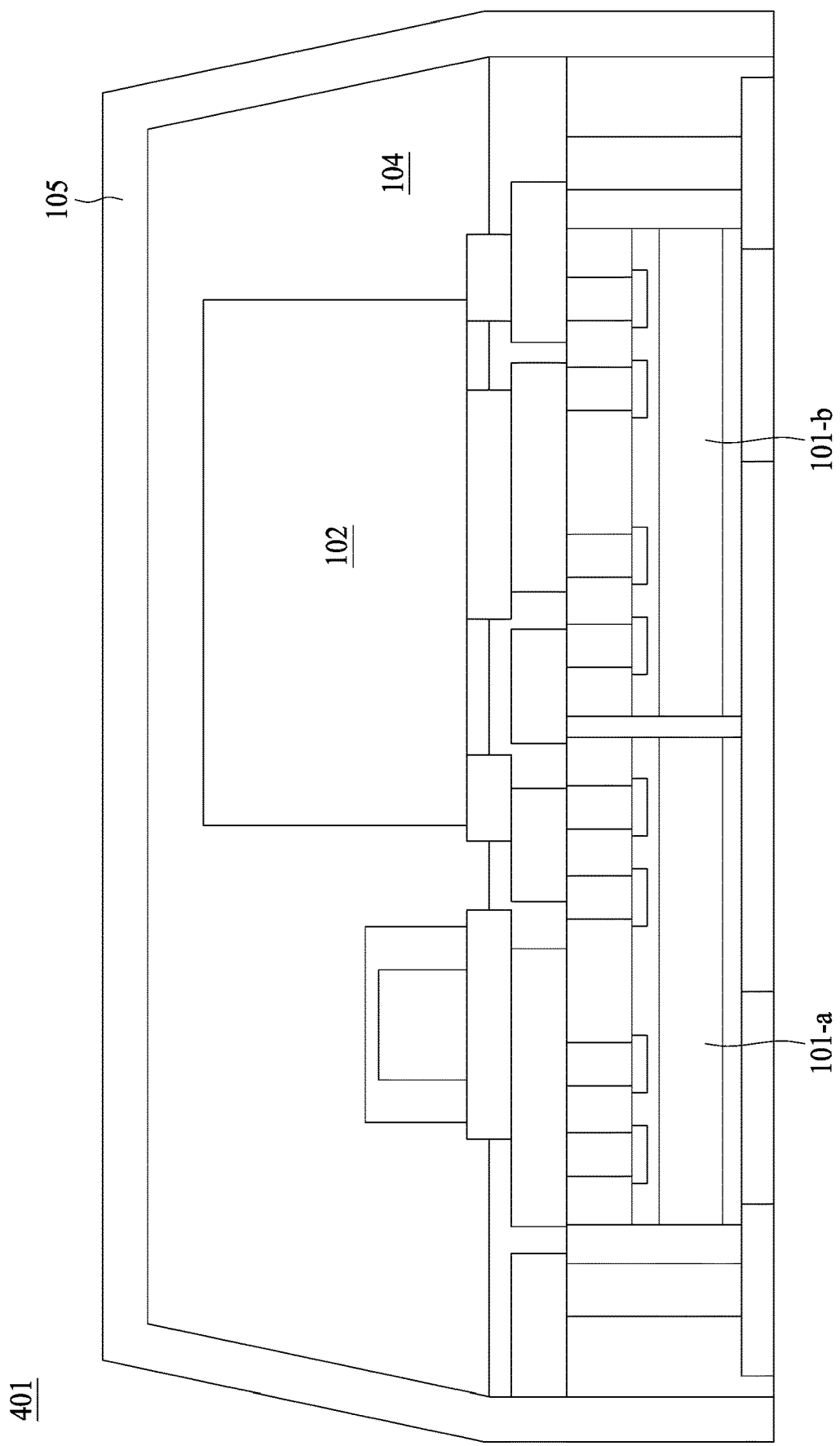
FIG. 8A to FIG. 8E respectively represents a cross sectional view of several anti-EMI semiconductor devices in accordance with some embodiments.

FIG. 8A shows a semiconductor device 401 having a shield 105 covering an integrated semiconductor package. The integrated semiconductor package may include two semiconductor dies 101-*a* and 101-*b* in the first level and an electronic component 102. The electronic component 102 is coupled with the semiconductor dies 101-*a* and 101-*b* through the conductive traces in the middle region 110. The shield 105 is conformally covering the integrated semiconductor package and having a tapered surface proximal to the electronic component 102.

Figure 8B:
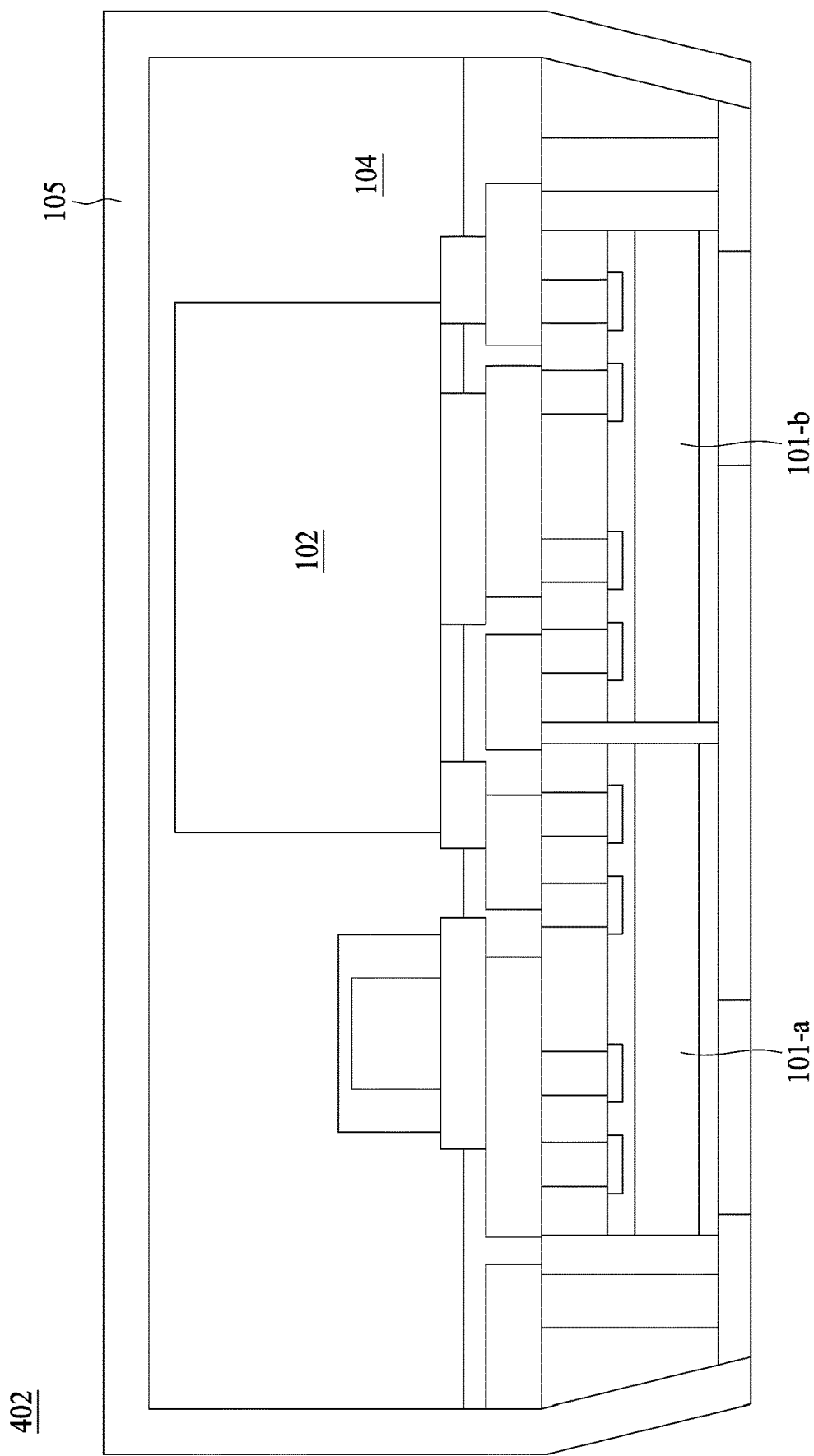
Figure 8C:
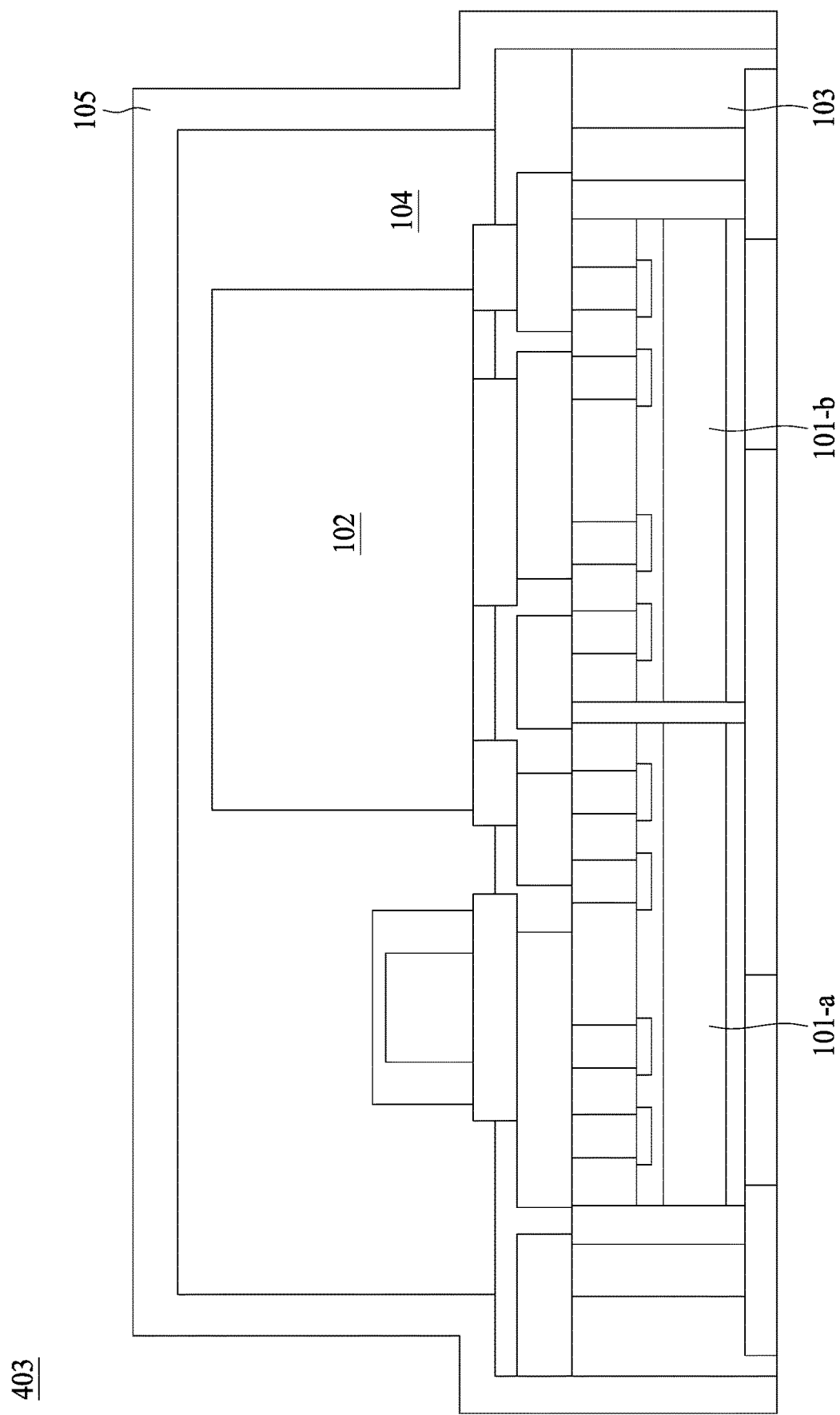
Figure 8D:
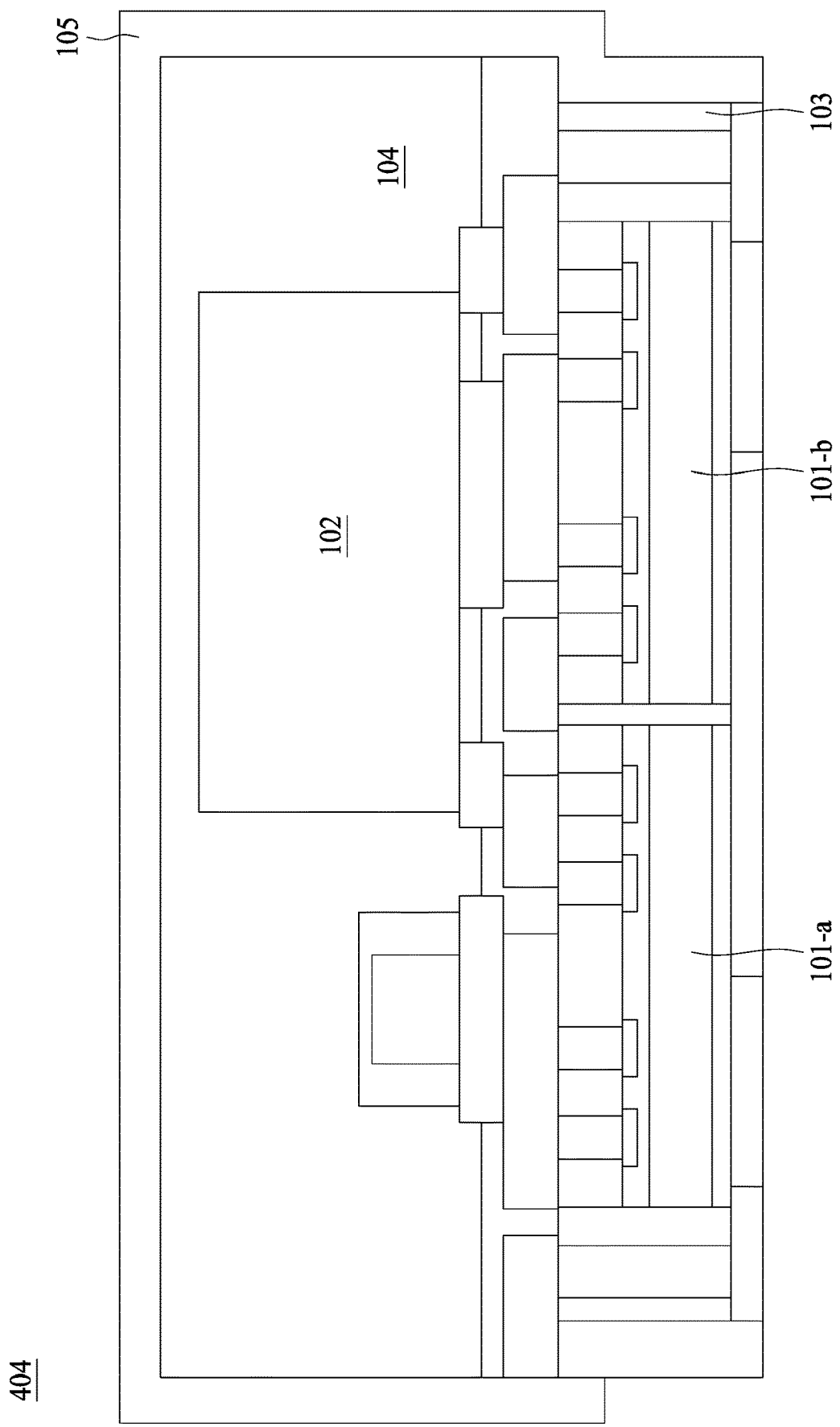
Figure 8E:
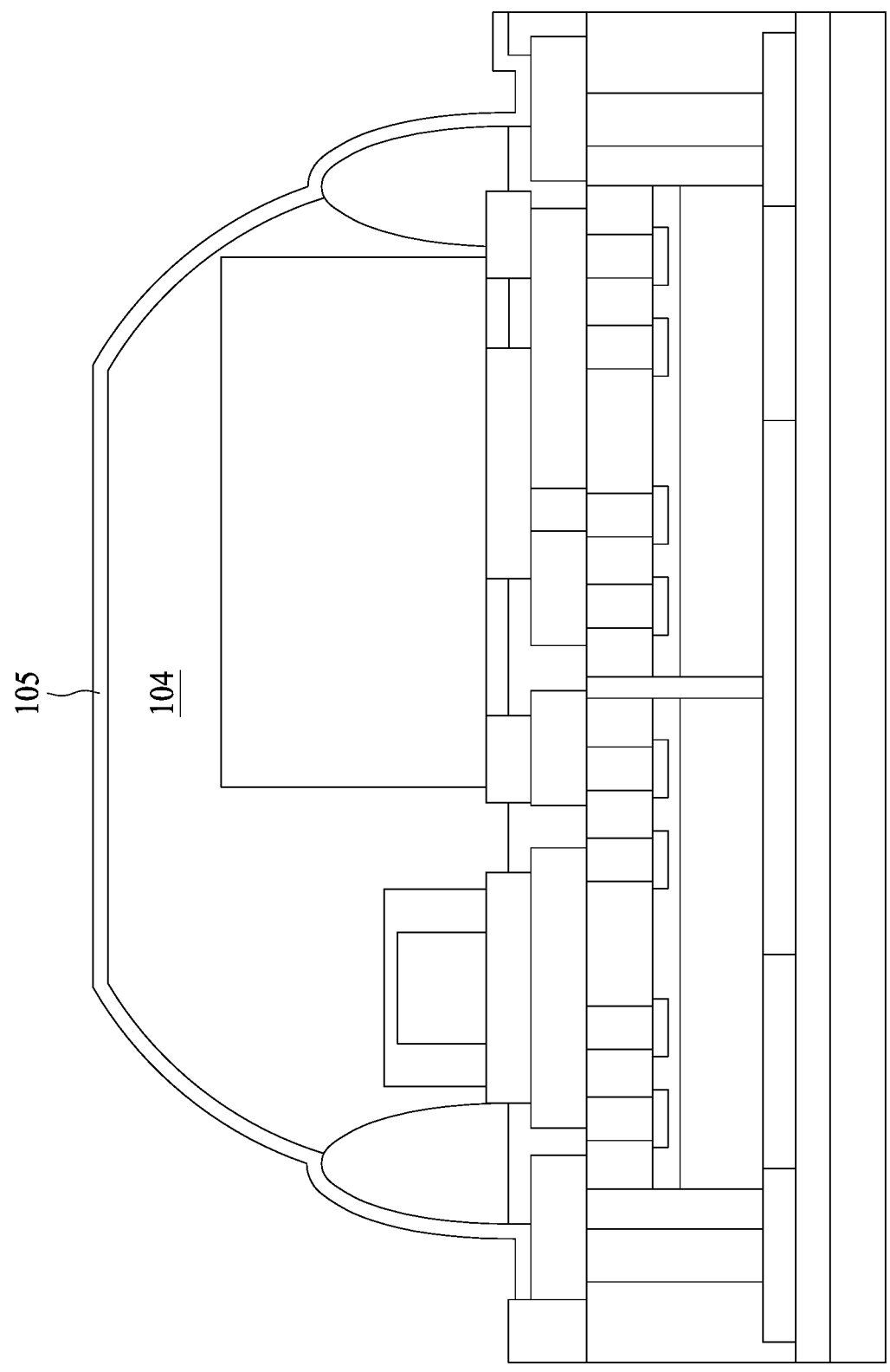

FIG. 8B shows another semiconductor device 402 having a shield 105 covering an integrated semiconductor package. The shield 105 has a tapered portion proximal to the semiconductor dies 101-*a* and 101-*b*. FIG. 8C shows another semiconductor device 403 having a shield 105 covered. The second level 104 is narrower than the first level dielectric 103, thus the shield 105 is in a stepped configuration. FIG. 8D shows another semiconductor device 404 with a shield 105 covered. The second level 104 is wider than the first level dielectric 103, thus the shield 105 is in a stepped configuration. FIG. 8E shows another semiconductor device 404 with a shield 105 covered. The second level 104 is substantially shaped like a dome, thus the shield 105 is in a dome configuration. The conformal shield 105 follows the shape and morphology of a portion of an outer surface of the integrated semiconductor package.

In the present disclosure, a method is provided to form a conformal EMI shield on an integrated semiconductor package. The integrated semiconductor package includes several electronic components such as logic or memory semiconductor die. Some conductive traces and vias are laid in the package to redistribute interconnections between those electronic components. Some operations of forming a shield-protected semiconductor device are illustrated below for better understanding.

Figure 9A:
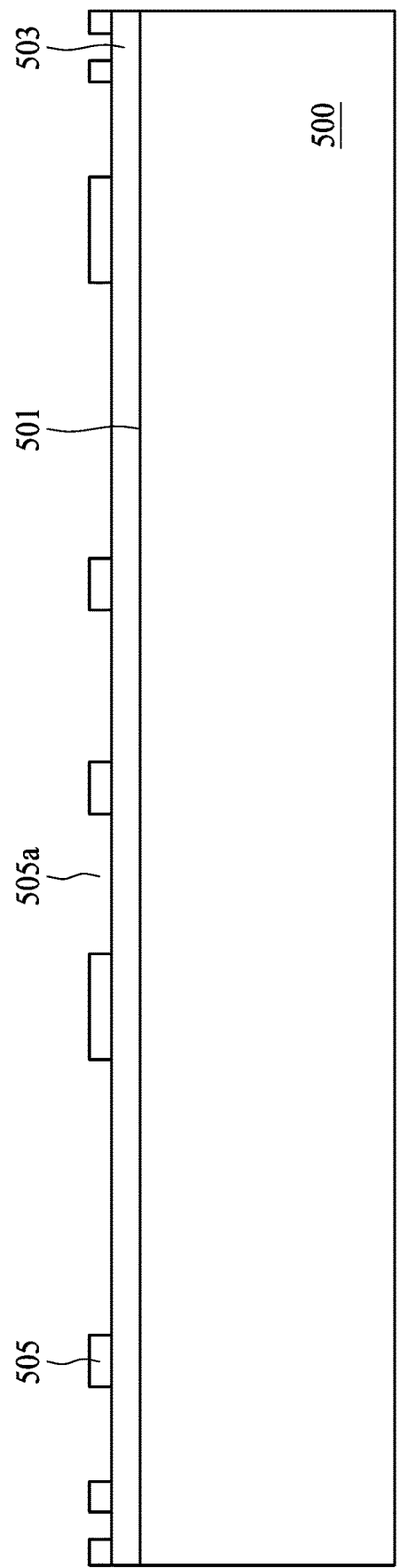
FIG. 9A to FIG. 9G are operations of a method of manufacturing an anti-EMI semiconductor devices in accordance with some embodiments.

In FIG. 9A, a substrate 500 is provided as a carrier or support. A patterned layer 505 is disposed over a top surface 501 of the substrate 500. The patterned layer 505 may be formed by coating a blanket film over the top surface 501 and then carving out a portion of the blanket film to form several openings 505*a* to expose surface underneath the blanket 505. In some embodiments, a light-sensing material such as polyimide, PBO, is used to form the blanket film on the top surface 501, then followed by an photolithography or etch operation to form the pattern layer 505. An interfacial layer 503 can be optionally disposed between the pattern layer 505 and the substrate 500.

Figure 9B:
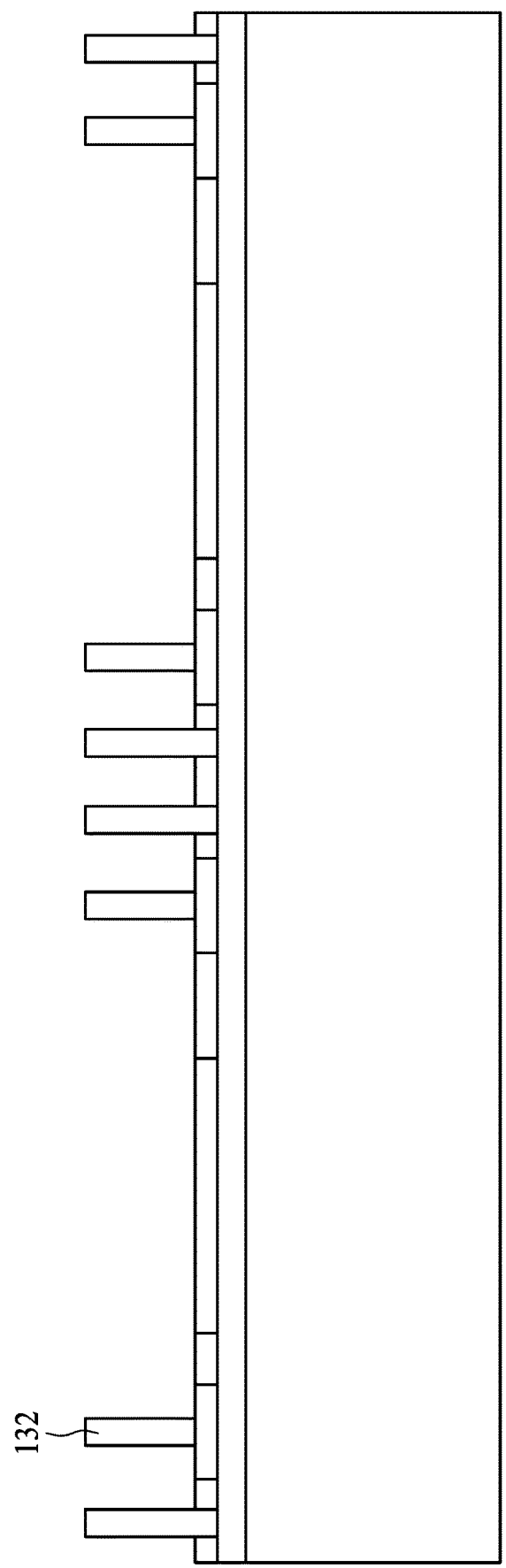

In FIG. 9B, a conductive material is filled in the openings 505*a* and further extended upwardly from the top surface 501. A conductive post corresponding to the TIV 132 in FIG. 1A is formed. In a wafer level process, several posts are formed in a pre-determined pattern as in FIG. 9B. Some neighboring TIVs are arranged in an optimized spacing in order to have some electronic components disposed there between.

Figure 9C:
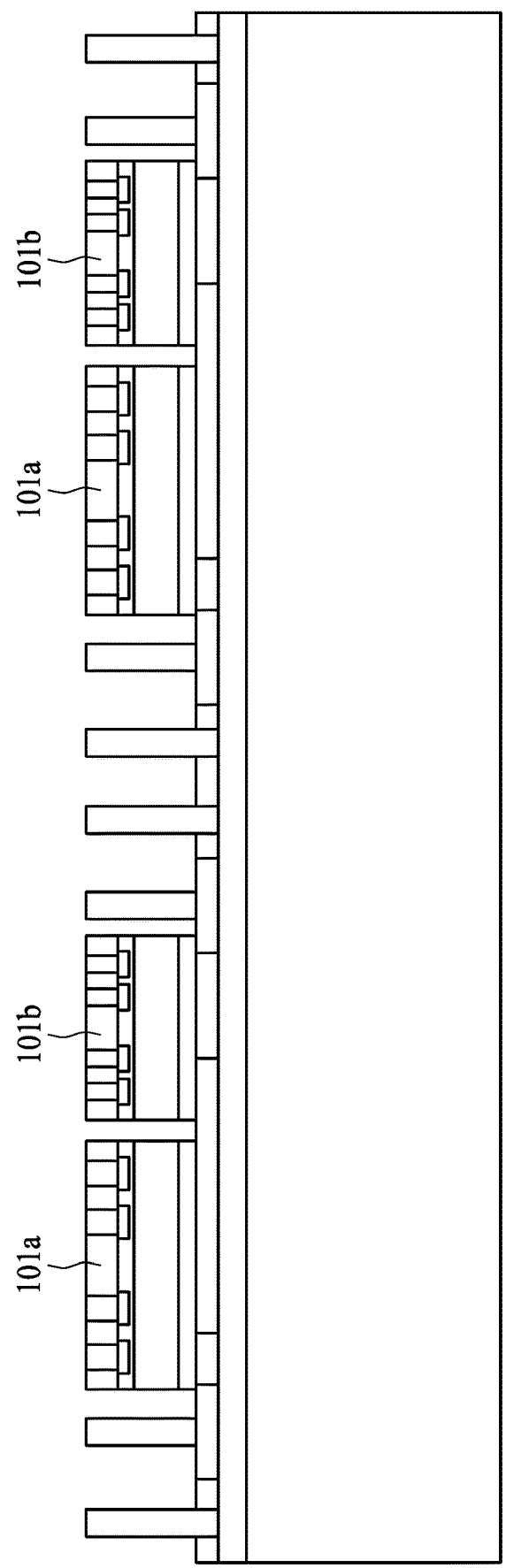

The electronic components disposed between TIVs may be a singulated semiconductor die or a packaged component. As in FIG. 9C, two singulated semiconductor dies 101-*a* and 101-*b* corresponding to the semiconductor dies in FIG. 6 are inserted between two TIV. The other two dies right to 101-*a* and 101-*b* are used to represent repetitive features disposed on the substrate 500.

Figure 9D:
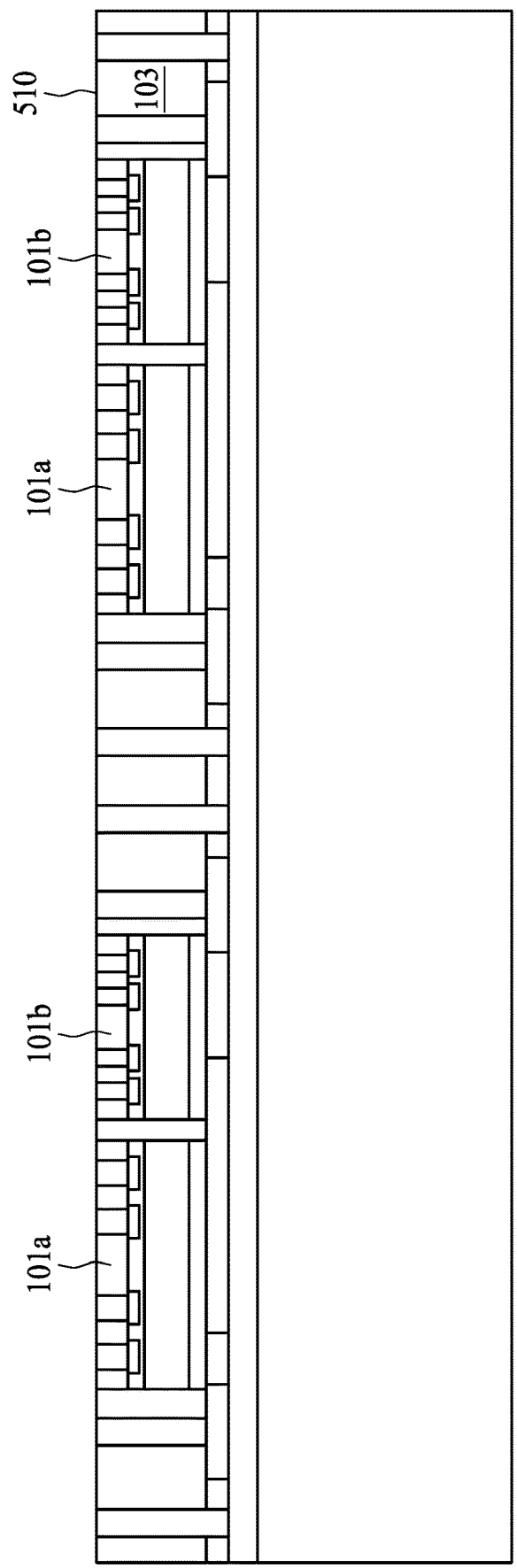

A molding is disposed on over the top surface 501 and fills gaps between TIVs, or the semiconductor dies 101-*a* and 101-*b*. The molding may overfill to cover the top surface of TIVs and semiconductor dies 101-*a* and 101-*b*. A grinding operation is introduced to remove excessive molding in order to expose the TIV and the semiconductor dies 101-*a* and 101-*b*. As shown in FIG. 9D, a planar surface 510 is formed and the contact points of TIV and the semiconductor dies 101-*a* and 101-*b* are exposed in order to receive other conductive structures disposed later on. After the molding and grinding operations, a dielectric layer corresponding to the first level dielectric 103 in FIG. 1A is formed.

As used herein, "molding" refers to a compound formed with composite materials. Non-limiting examples of the molding materials includes epoxy resins, phenolic hardeners, silicas, catalysts, pigments, mold release agents, or the like. Material for forming a molding compound has a high thermal conductivity, a low moisture absorption rate, a high flexural strength at board-mounting temperatures, or a combination thereof.

Figure 9E:
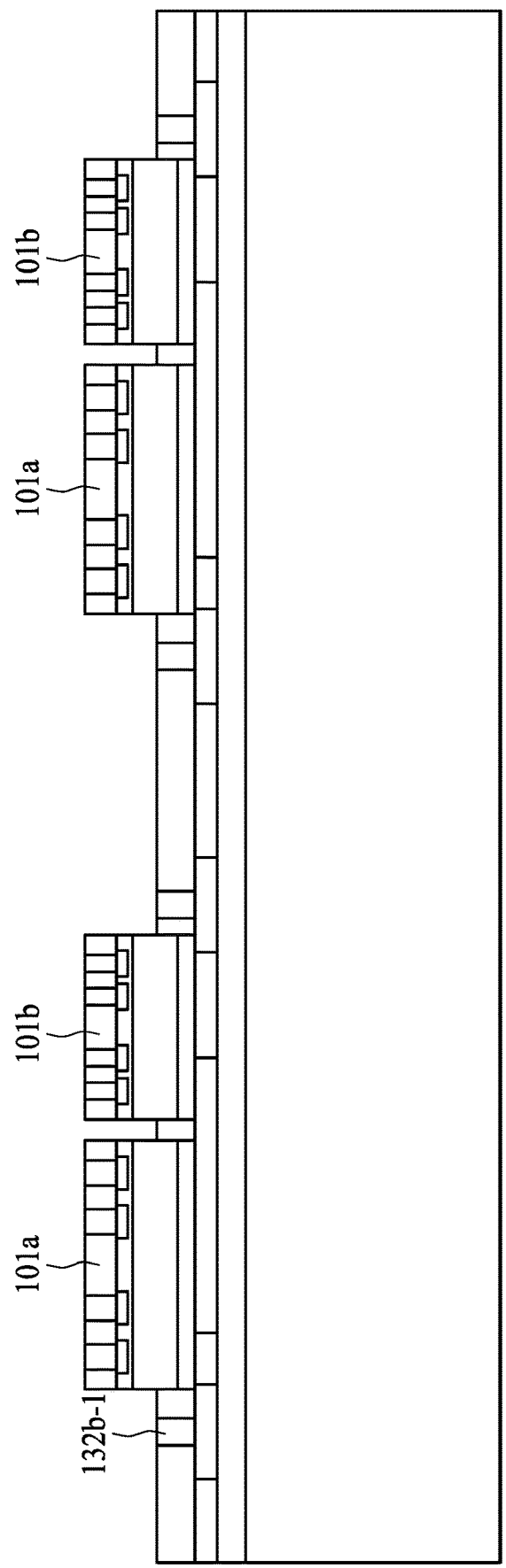
Figure 9F:
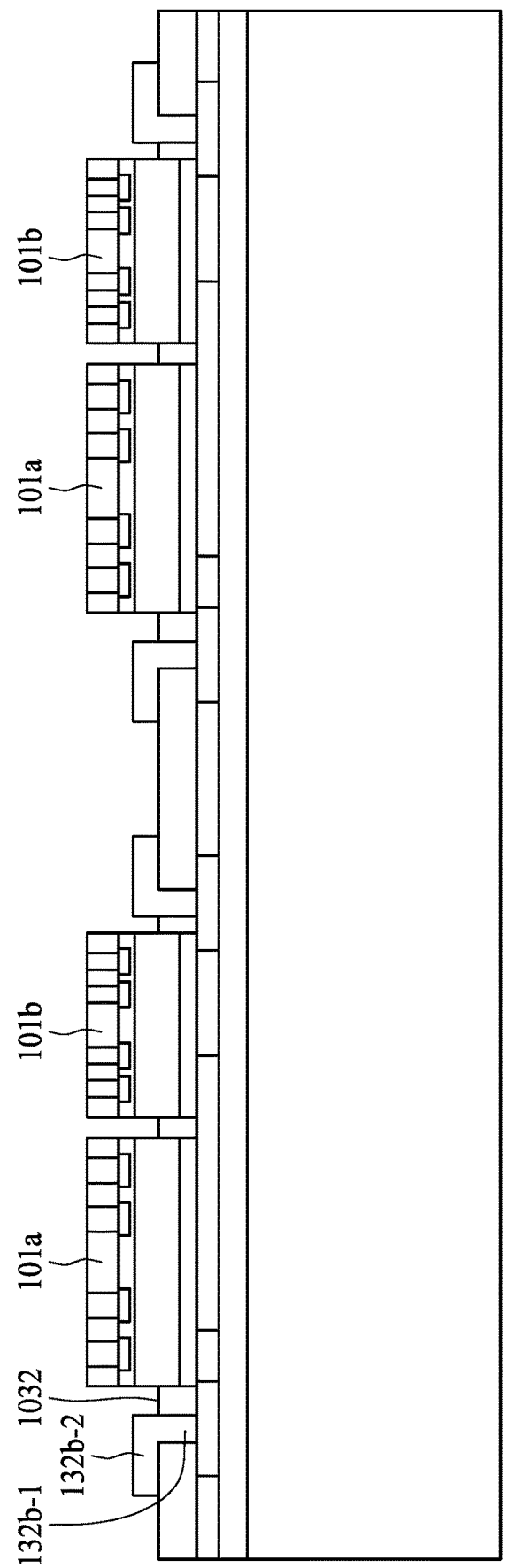
Figure 9G:
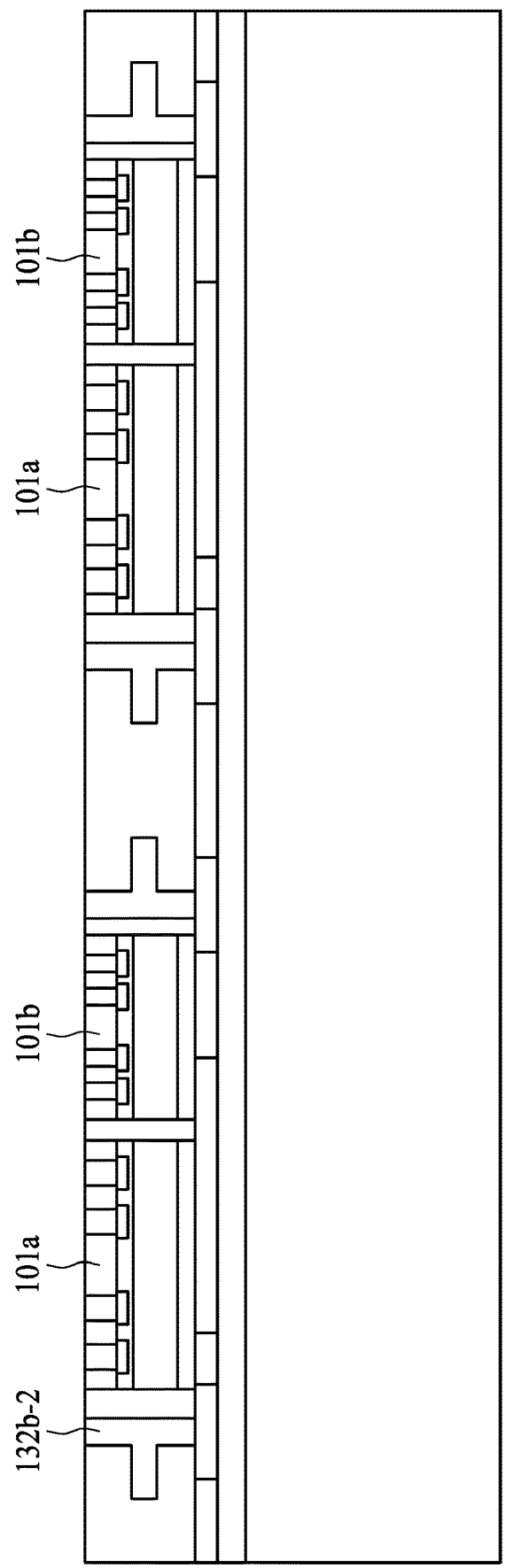

For some embodiments as shown in FIG. 6, an extra conductive trace 132*a* is embedded in the molded first level dielectric 103 and further attached to the upward TIV 132*b*. FIG. 9E to FIG. 9G show a multi-staged filling operation wherein there are at least two operations used to form the first level dielectric 103. In FIG. 9E a partial filling operation is performed to partially cover the semiconductor dies 101-*a* and 101-*b* with a molding material. A section 132*b*-1 of TIV is formed in the molding. In FIG. 9F, the conductive trace 132*a* is formed along the exposed surface 1032 of the partial filled molding. In FIG. 9G, the second section 132*b*-2 of TIV is formed to extend further upwardly. Another filling operation is performed to have the molding surround the TIV and semiconductor dies 101-*a* and 101-*b*. As mentioned in the description corresponding to FIG. 6, the conductive branch 132*a* can be further connected to the shield 105 so as to provide a grounding path to the shield 105.

For some embodiments, a conductive ring is disposed over the substrate to circumscribe each to-be singulated packaged unit before the molding is filled over the substrate. The conductive ring forms as the retainer 135 shown in FIG. 7A.

Figure 10A:
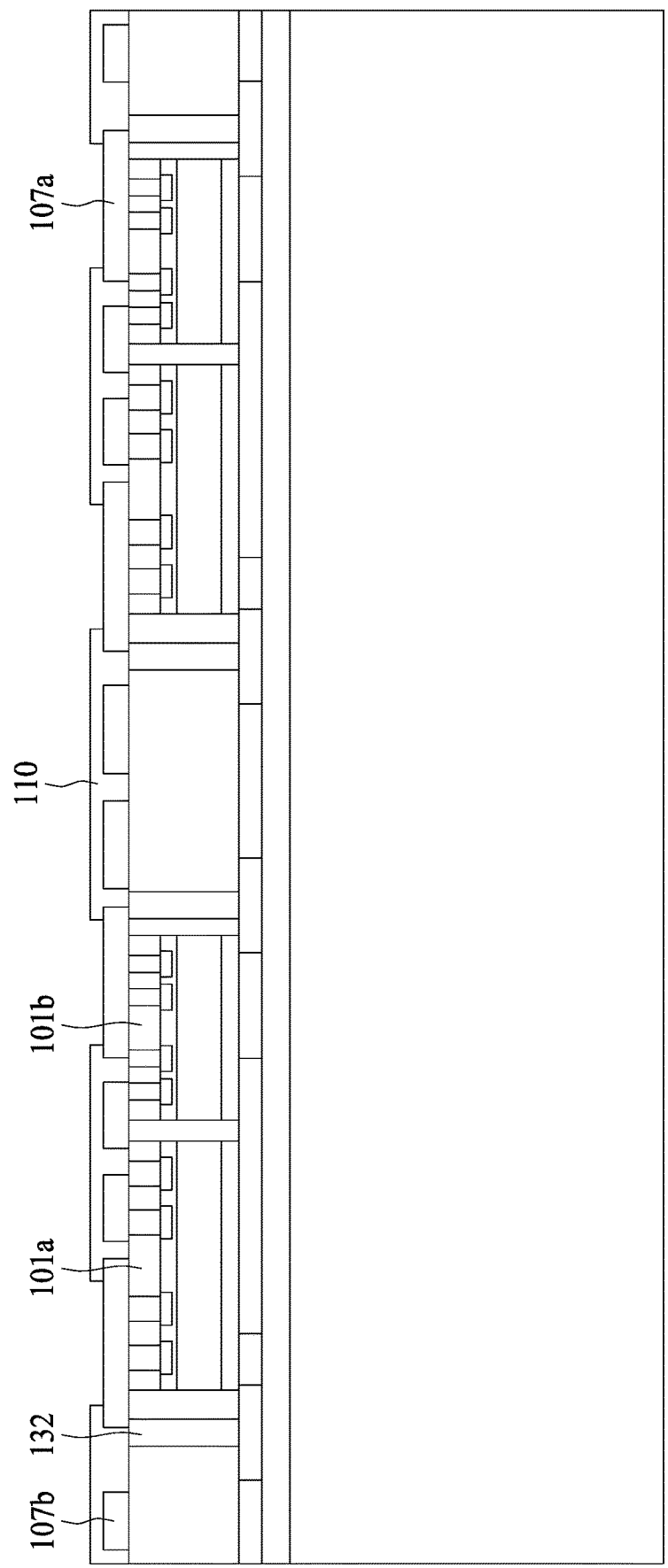
FIG. 10A to FIG. 10B are operations of a method of manufacturing an anti-EMI semiconductor devices in accordance with some embodiments.

In FIG. 10A, after the first level dielectric 103 is formed, some conductive structures 107 are disposed over the first level dielectric 103 and connected with the exposed TIV 132 and contact points of the semiconductor dies 101-*a* and 101-*b*. The conductive structures include conductive traces like RDL, PPI (post passivation interconnect), vias, or seal ring. All the conductive structures can be included in the middle region 110 as shown in FIGS. 1A, 3, 6, or other similar embodiments. Some conductive traces are configured as active RDL, or PPI 107*a* shown in FIG. 6 to have electrical connection with the contact points of the semiconductor dies 101-*a* and 101-*b*. Some conductive traces are configured as seal ring or grounding path as the conductive trace 107*b* shown in FIG. 1A.

Figure 10B:
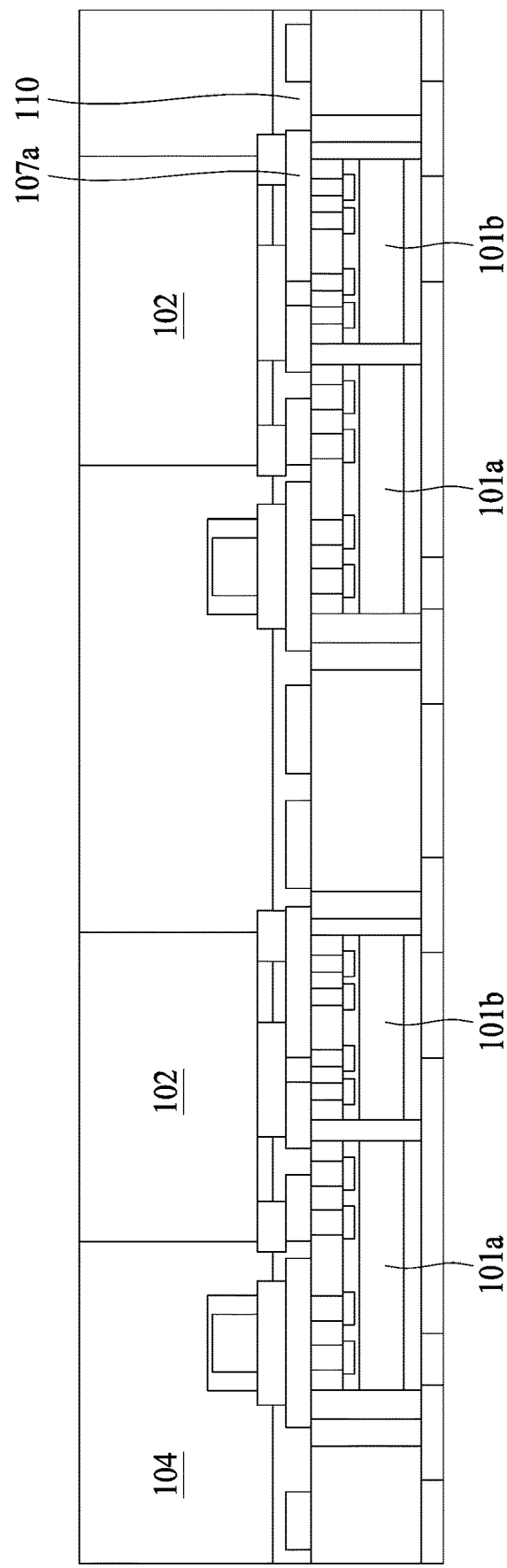

In FIG. 10B, an electronic component 102 is mounted over the semiconductor dies 101-*a* and 101-*b* after the middle region 110 is formed. The electronic component 102 is electrically connected with the semiconductor dies 101-*a* and 101-*b* through active RDL or PPI 107*a*. A molding can be further filled to surround the electronic component 102 to form the second level 104 as shown in FIG. 1A or other similar embodiments.

For some embodiments, a dielectric material different from molding is adopted to cover and surround the electronic component 102. The dielectric material may be more conformal so as to follow the topography above the middle dielectric 110 as in FIG. 7. The dielectric material used to fill the second level 104 can be formed by deposition. As used herein, "vapor deposition" refers to process of depositing materials on a substrate though the vapor phase. Vapor deposition processes include any process such as, but not limited to, chemical vapor deposition (CVD) and physical vapor deposition (PVD). Examples of vapor deposition methods include hot filament CVD, rf-CVD, laser CVD (LCVD), conformal diamond coating processes, metal-organic CVD (MOCVD), sputtering, thermal evaporation PVD, ionized metal PVD (IMPVD), electron beam PVD (EBPVD), reactive PVD, atomic layer deposition (ALD), and the like. PECVD, HDPCVD, LPCVD.

The substrate 500 used in the aforementioned method may include silicon, glass, blue tape, dry film, etc. The original substrate 500 may be replaced with a different substrate during a transfer operation which is omitted in the present disclosure.

A singulation operation is performed to cut the wafer level package into several individual integrated semiconductor packages. In the present disclosure, there are various singulation operations provided. Following shows an example of a multi-staged cleaving operation adopted to singulate a wafer level package.

Figure 11A:
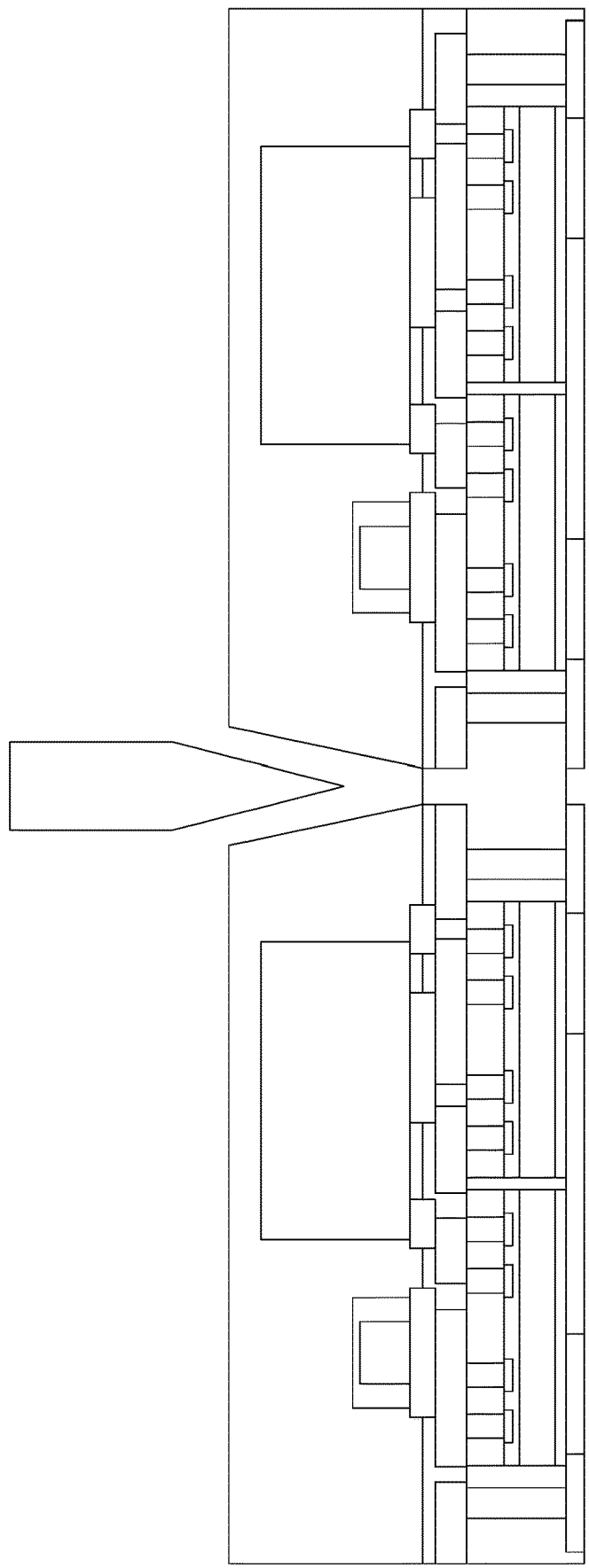
FIG. 11A to FIG. 11D are operations of a method of manufacturing an anti-EMI semiconductor devices in accordance with some embodiments.
Figure 11B:
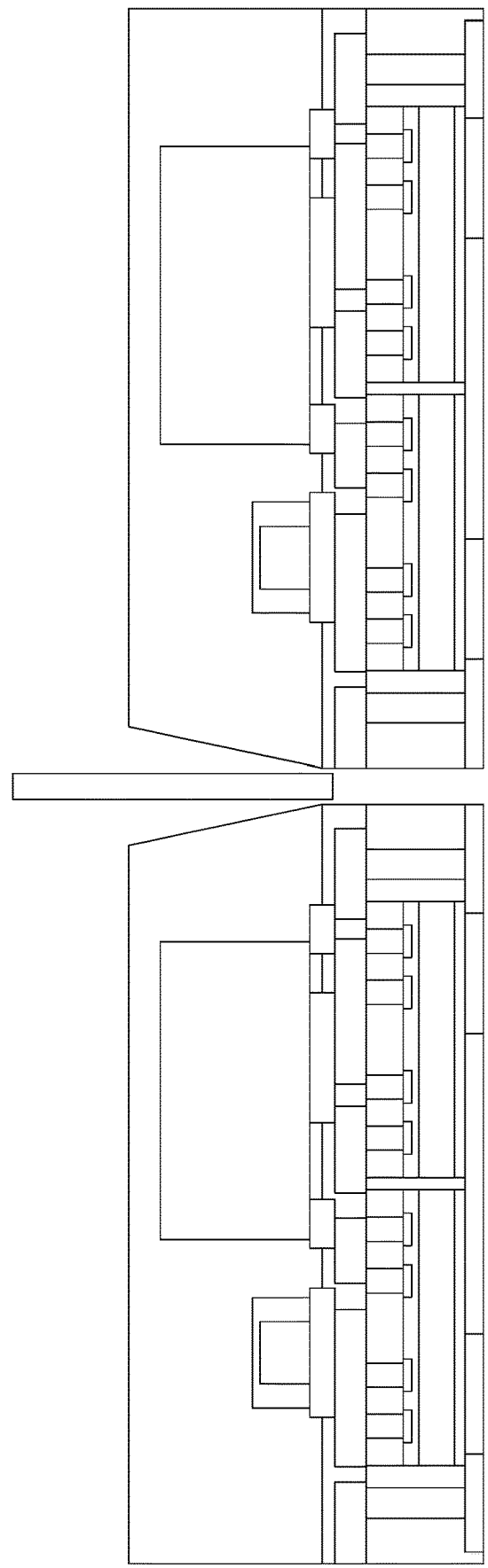
Figure 11C:
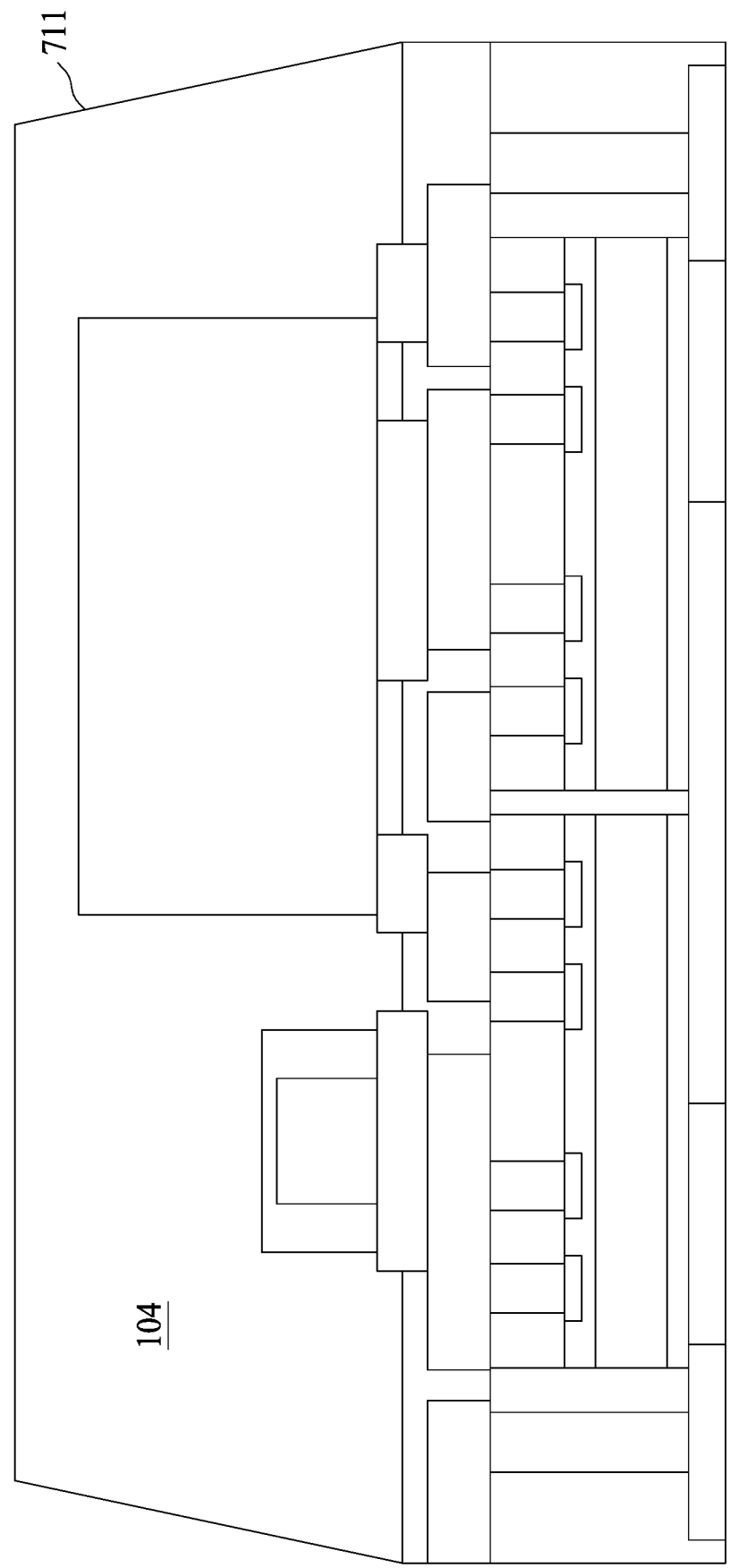
Figure 11D:
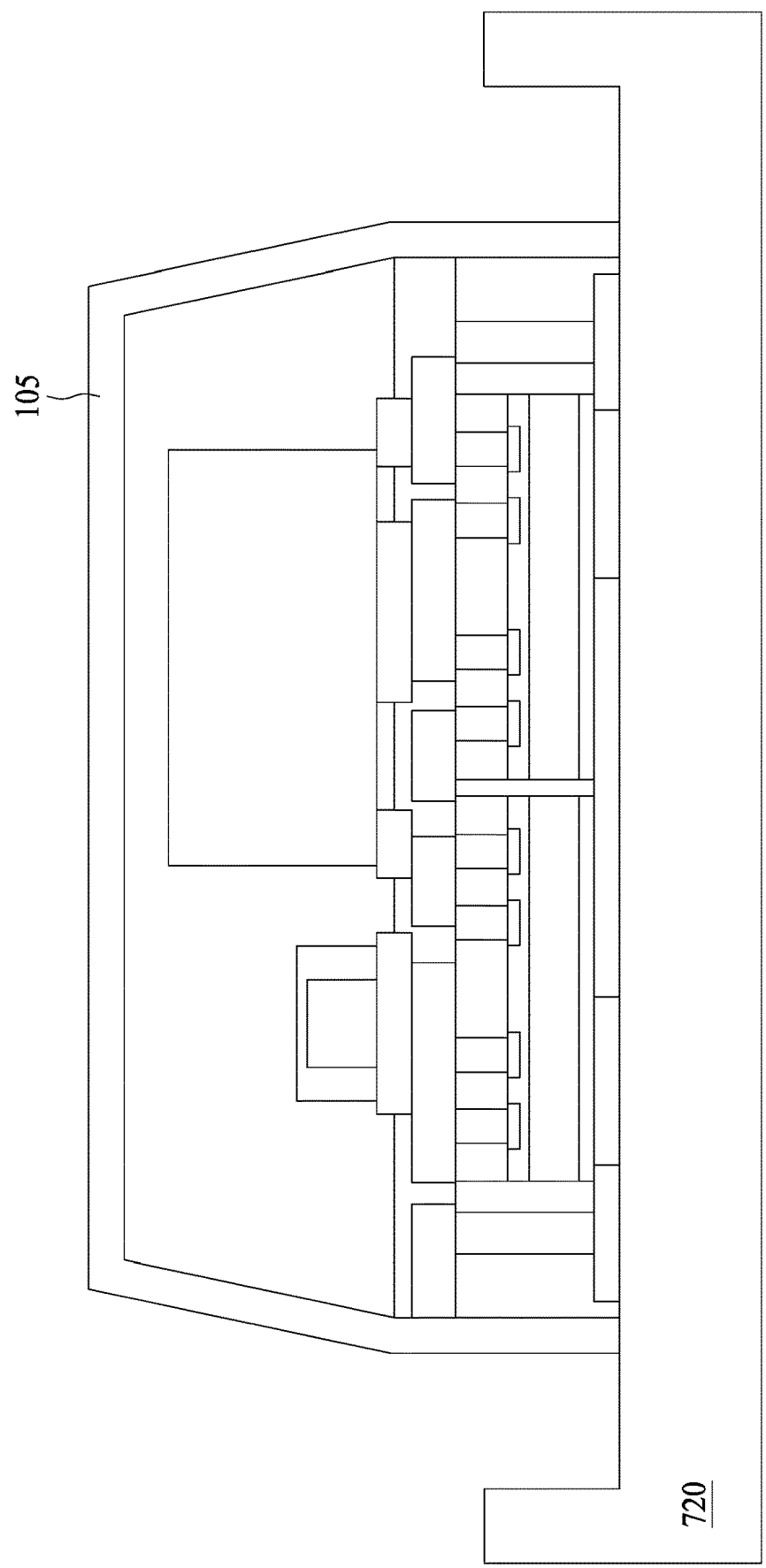
Figure 12A:
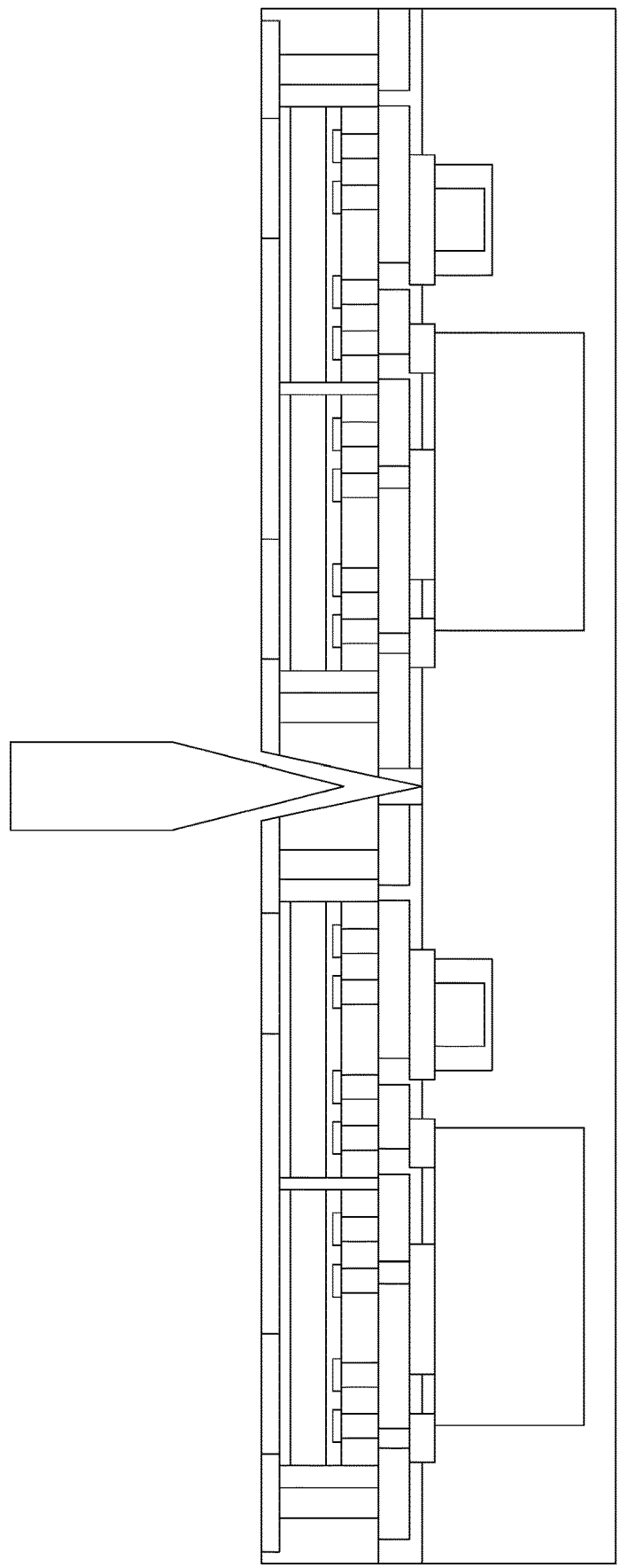
FIG. 12A to FIG. 12D are operations of a method of manufacturing an anti-EMI semiconductor devices in accordance with some embodiments.
Figure 12B:
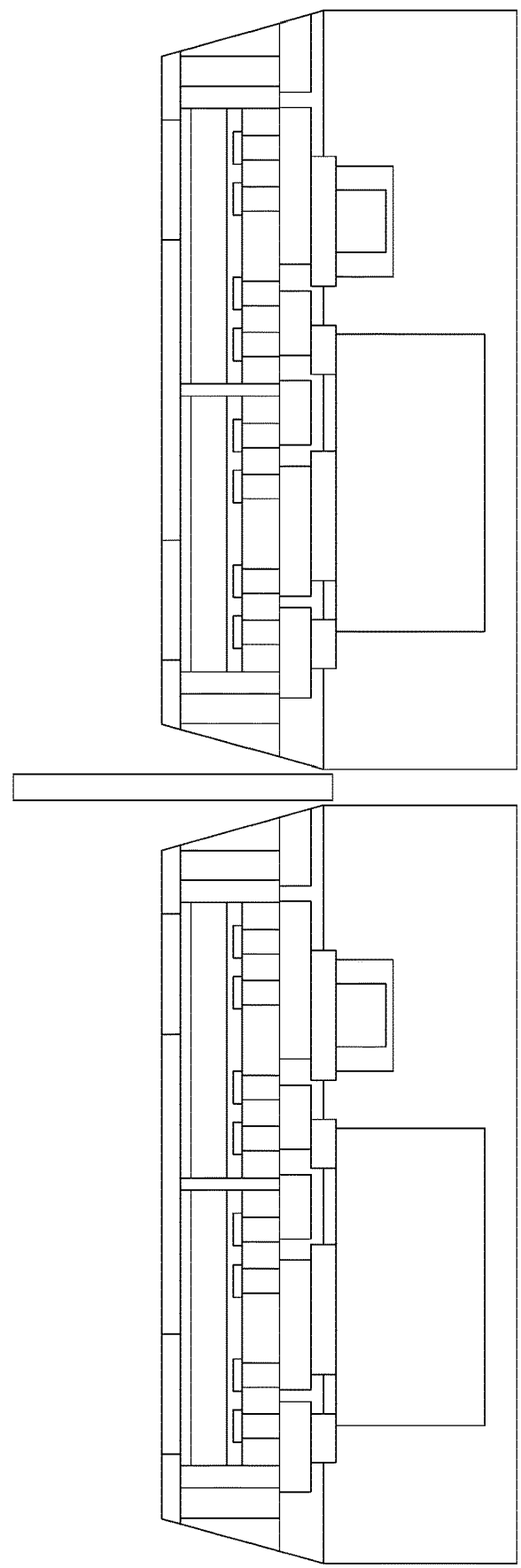
Figure 12C:
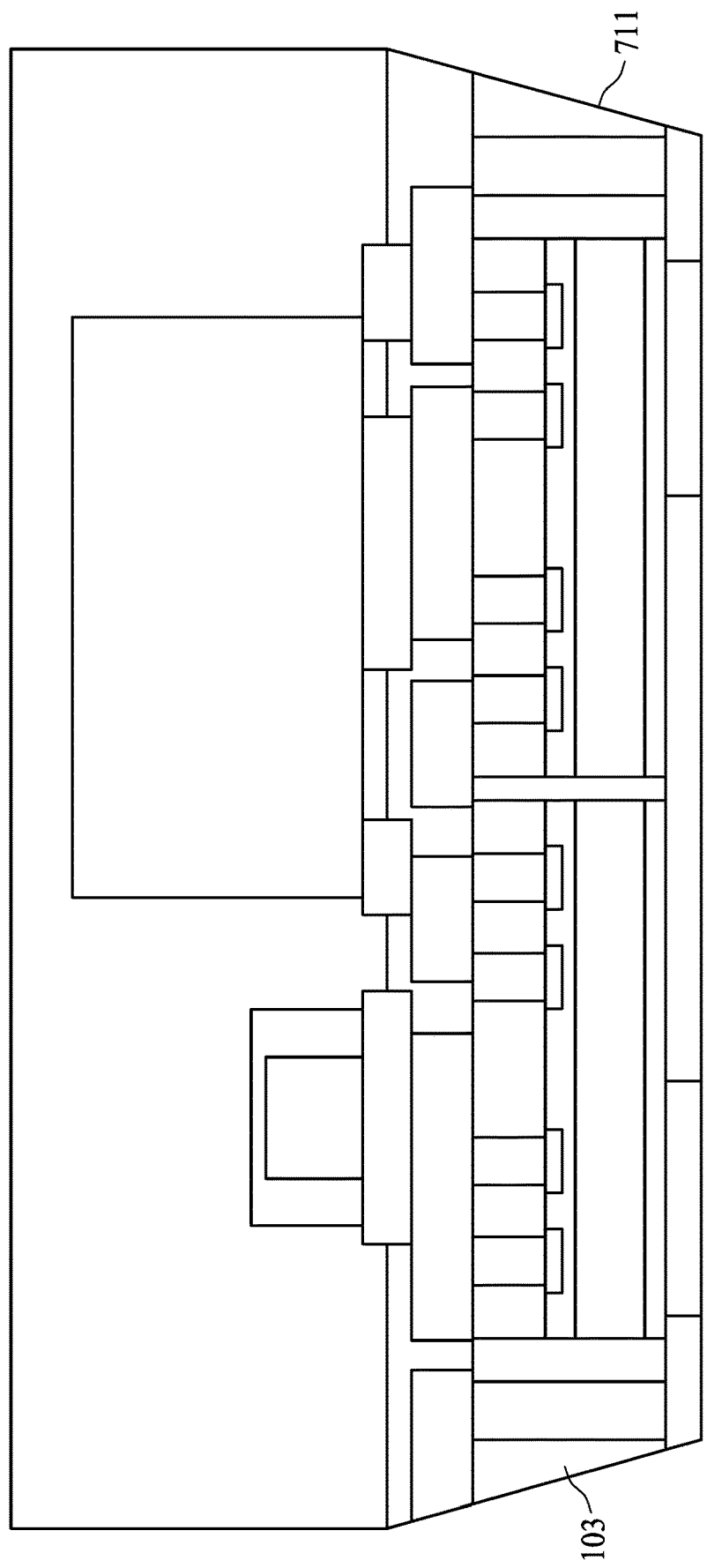
Figure 12D:
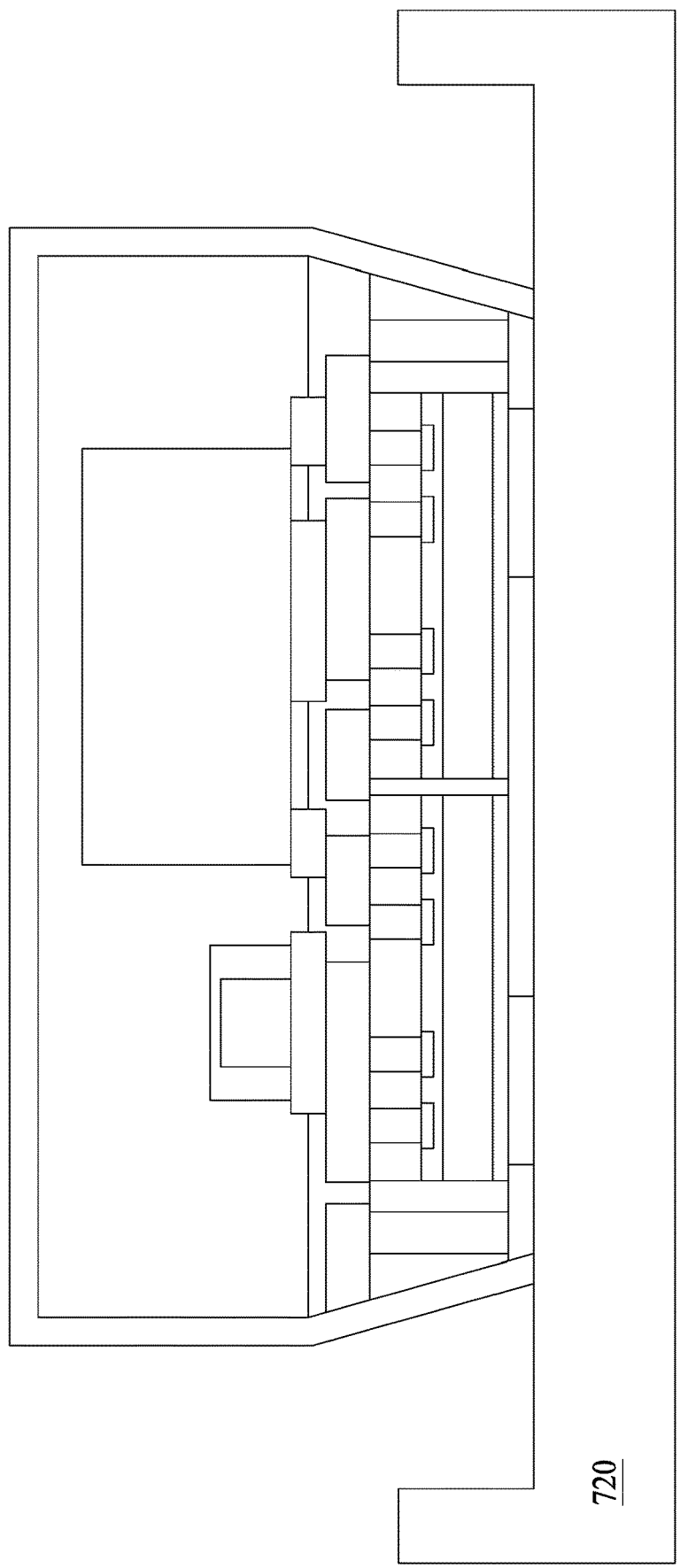

In FIG. 11A, a coarse cut is performed to make a first cleave extending from the top surface of the molding or dielectric of the second level. The coarse cut is followed by a fine cut as shown in FIG. 11B. The fine cut goes from the bottom of the first cleave and further extends through the first level and separates adjacent integrated semiconductor packages. Each singulated integrated semiconductor package includes a. tapered sidewall 711 in the second level 104 as shown in FIG. 11C. The integrated semiconductor package can be placed on a stage 720 as in FIG. 11D and a deposition or coating operation is applied to form an EMC shield 105 on the top and sidewall of the integrated semiconductor package. The embodiment 401 shown in FIG. 8A is an example manufactured by adopting the operations shown in FIG. 11A to FIG. 11D.

In some embodiments, the coarse cut starts from a surface opposite to the top surface of the molding or dielectric of the second level. FIGS. 12A-12D illustrate a similar singulation operation as shown in FIGS. 11A-11D, however, the first cleave starts proximal to the first level of the integrated semiconductor package. The tapered sidewall 711 is around the first level 103. The cutting operation can be performed by a mechanical saw blade, laser, or other suitable cleaving tools.

Figure 13A:
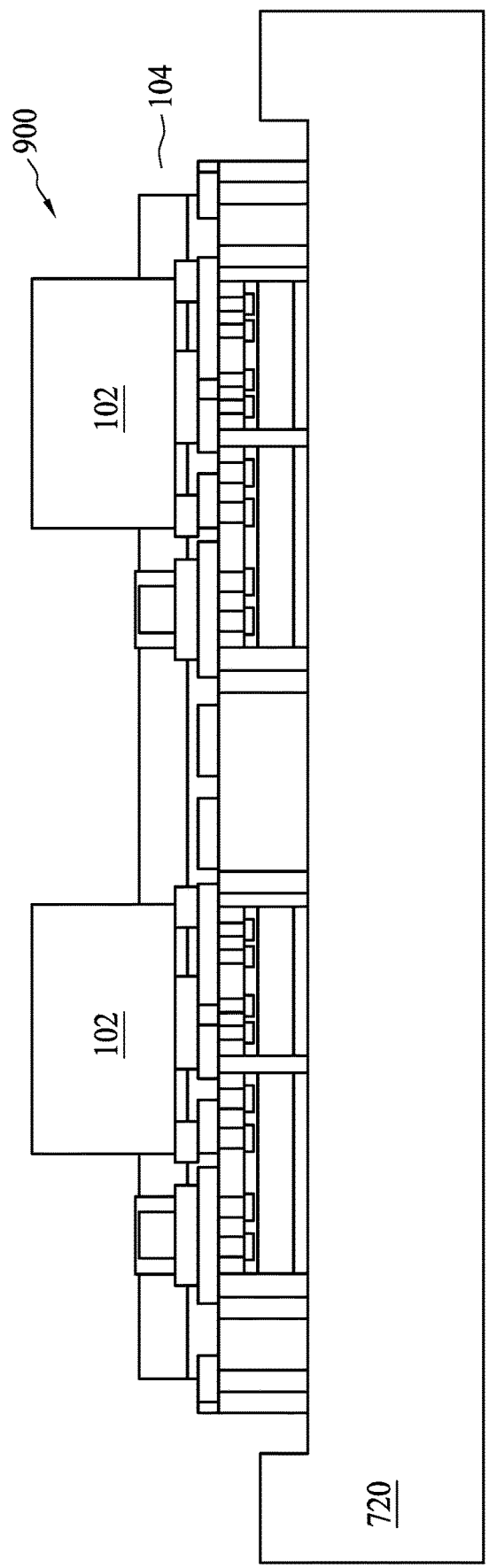
FIG. 13A to FIG. 13C are operations of a method of manufacturing an anti-EMI semiconductor devices in accordance with some embodiments.
Figure 13B:
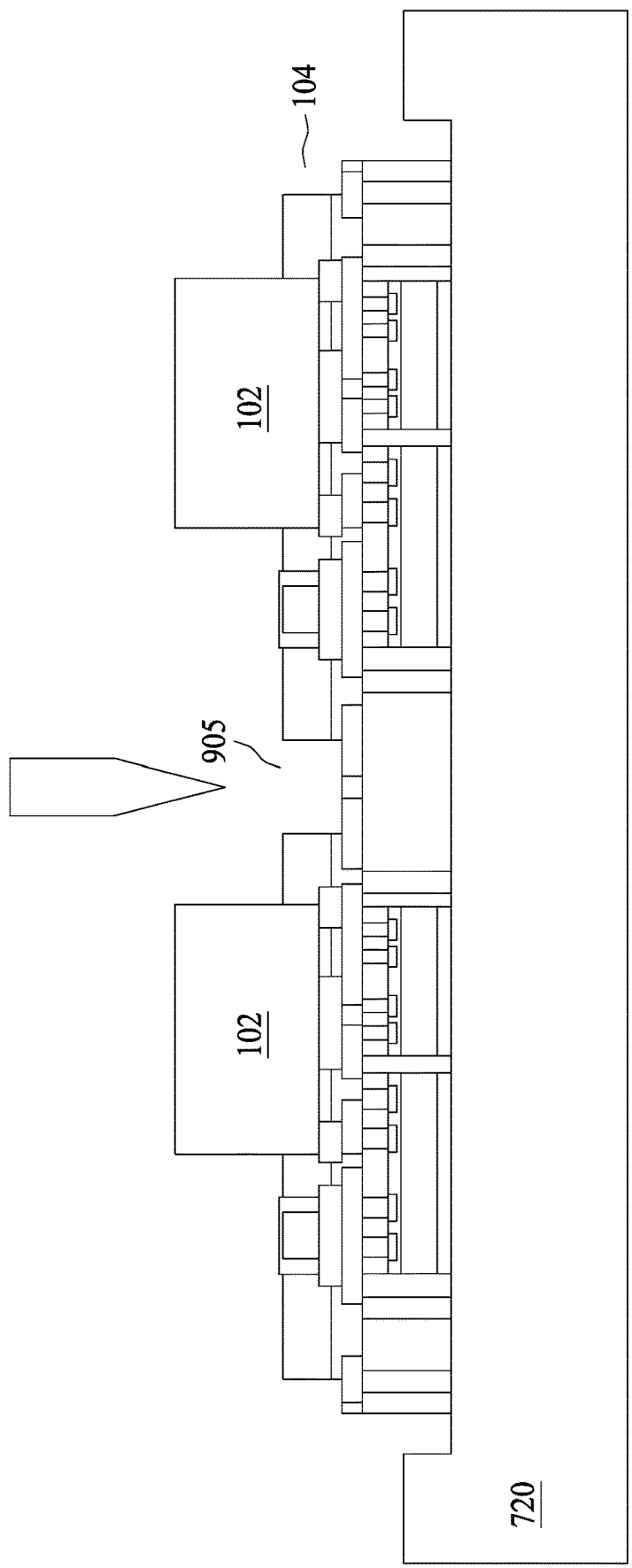
Figure 13C:
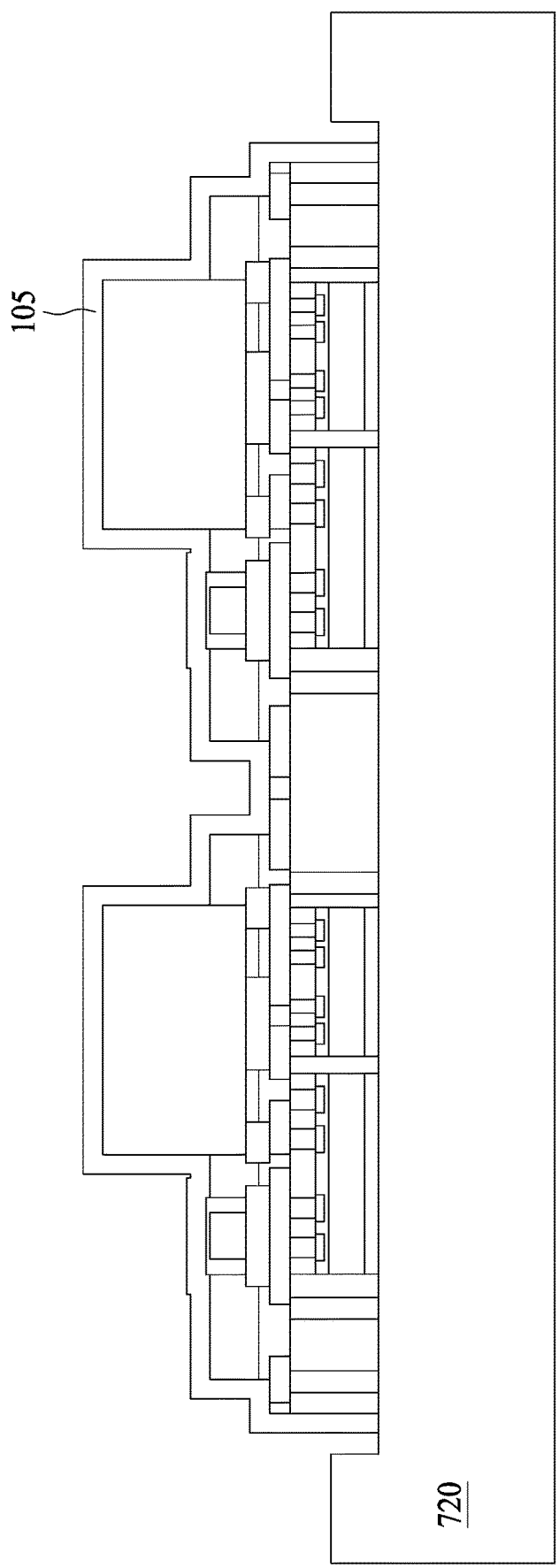

The shield coating operation can be applied before or after the singulation operation. FIG. 11A to FIG. 11D and FIG. 12A to FIG. 112D illustrate the examples that have singulation operation performed before the shield formation. In FIG. 13A-13C, the examples that have singulation operation performed after the shield formation are illustrated.

In FIG. 13A, a to-be-singulated wafer level package 900 is provided and disposed on a substrate or tray 720. The topography of the wafer level package 900 is not even and the electronic component 102 in the second level 104 is only partially covered by the dielectric.

In FIG. 13B, a preliminary cut is performed to produce a recess 905 between adjacent to-be-singulated package units. In FIG. 13C, the entire wafer level package 900 is covered with a conductive layer as a shield. The top surface and a portion of the sidewalls of each to-be-singulated package unit are enclosed within the shield 105. The conductive layer can be disposed by a coating or deposition operation. A main cut is performed after the shield formation to produce several singulated shielded integrated semiconductor package.

A method of manufacturing a semiconductor device includes several operations. The method includes providing a semiconductor die and surrounding a sidewall of the semiconductor die with a dielectric material. The method further includes forming a post passivation interconnect (PPI) over the semiconductor die and electrically coupling the PPI with the semiconductor die. The method further includes molding the semiconductor die and the PPI into an integrated semiconductor package. The method further includes covering at least a portion of an outer surface of the integrated semiconductor package with a conductive layer, wherein the conductive layer is conformal to the morphology of the portion of the outer surface. Moreover, the method further includes forming a conductive path inside the integrated semiconductor package electrically coupled to the conductive layer and a ground terminal of the integrated semiconductor package.

A method of manufacturing a semiconductor device is provided. The method includes: a substrate is provided. A first section of a conductive post is formed over the substrate. A semiconductor die is disposed over the substrate. A first dielectric layer is formed to surround a sidewall of the semiconductor die. In some embodiments, a top surface of the first dielectric layer is lower than a top surface of the semiconductor die. A second section of the conductive post is formed to couple to the first section over the top surface of the dielectric layer. A third section of the conductive post is formed to couple to the second section. A second dielectric layer is formed to surround the sidewall of the semiconductor die.

A method of manufacturing a semiconductor device is provided. The method includes: substrate is provided. A ground terminal is formed over the substrate. A plurality of conductive posts is formed over the substrate. A semiconductor die is disposed over the substrate. A sidewall of the semiconductor die is surrounded with a first molding. A conductive trace is formed to couple to one of the conductive posts. A second molding is disposed over the conductive trace. A multi-staged cleaving operation is performed to singulate an integrated semiconductor package. An EMI shield is formed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
   providing a substrate;
   forming a first section of a conductive post over the substrate;
   disposing a semiconductor die over the substrate after the forming of the first section of the conductive post;
   forming a first portion of a dielectric layer to surround and in contact with a sidewall of the semiconductor die, wherein a top surface of the first portion of the dielectric layer is lower than a top surface of the semiconductor die;

forming a second section of the conductive post coupled to the first section over the top surface of the first portion of the dielectric layer after the disposing of the semiconductor die;

forming a third section of the conductive post coupled to the second section after the disposing of the semiconductor die;

forming a second portion of the dielectric layer over the first portion of the dielectric layer to surround and in contact with the sidewall of the semiconductor die; and removing the substrate.

2. The method of claim 1, wherein the first section of the conductive post and the third section of the conductive post are extended along a direction perpendicular to a surface of the substrate.

3. The method of claim 2, wherein the second section of the conductive post is extended along a direction parallel with the surface of the substrate.

4. The method of claim 1, wherein the first section of the conductive post and the third section of the conductive post are between the semiconductor die and the second section of the conductive post.

5. The method of claim 1, wherein the first section, the second section and the third section of the conductive post are separated from the semiconductor die.

6. The method of claim 1, further comprising:
forming a patterned layer comprising an opening over the substrate; and
filling the opening with a conductive material,
wherein the first section of the conductive post is formed on the conductive material.

7. The method of claim 1, wherein the first portion of the dielectric layer and the second portion of the dielectric layer comprise a same material.

8. The method of claim 1, wherein a top surface of the second portion of the dielectric layer is aligned with a top surface of the third section of the conductive post and the top surface of the semiconductor die.

9. A method of manufacturing a semiconductor device, comprising:
providing a substrate;
forming a ground terminal over the substrate;
forming a plurality of conductive posts over the substrate;
disposing a first semiconductor die and a second semiconductor die over the substrate after the forming of the plurality of conductive posts;
surrounding a sidewall of the first semiconductor die and a sidewall of the second semiconductor die with a first molding;
forming a conductive structure over the first semiconductor die, the second semiconductor die and the first molding, wherein the conductive structure has a middle region between the first semiconductor and the second semiconductor die, and the conductive structure comprises a first conductive trace coupled to one of the conductive posts and a second conductive trace in the middle region, and the second conductive trace is separated from the first conductive trace and the plurality of conductive posts;
disposing an electronic component over the first semiconductor die, the second semiconductor die, a portion of the conductive structure, and the first molding;
disposing a second molding over the conductive structure, wherein the second molding surrounds and is in contact with a sidewall of the electronic component;
removing the substrate;
performing a multi-staged cleaving operation on the middle region of the conductive structure to singulate an integrated semiconductor package after the removing of the substrate; and
forming an electric magnetic interference (EMI) shield.

10. The method of claim 9, wherein the first molding is in contact with the sidewall of the first semiconductor die and the sidewall of the second semiconductor die.

11. The method of claim 9, wherein the multi-staged cleaving operation comprises:
performing a coarse cut to make a first cleave penetrating the second molding to expose the first molding; and
performing a fine cut to make a second cleave penetrating the first molding,
wherein a width of the first cleave is greater than a width of the second cleave, and the second molding has a tapered sidewall after the multi-staged cleaving operation.

12. The method of claim 11, wherein the EMI shield covers a top surface and the tapered sidewall of the second molding, a sidewall of the first molding and a sidewall of the conductive trace.

13. The method of claim 9, wherein the multi-staged cleaving operation comprises:
performing a coarse cut to make a first cleave penetrating the first molding to expose the second molding; and
performing a fine cut to make a second cleave penetrating the second molding,
wherein a width of the first cleave is greater than a width of the second cleave, and the first molding has a tapered sidewall after the multi-staged cleaving operation.

14. The method of claim 13, wherein the EMI shield covers a top surface and a sidewall of the second molding, the tapered sidewall of the first molding and a sidewall of the conductive trace.

15. The method of claim 9, wherein the EMI shield is coupled to the ground terminal through the first conductive trace and one of the conductive posts.

16. A method of manufacturing a semiconductor device, comprising:
providing a substrate;
forming a plurality of conductive posts over the substrate;
disposing a first semiconductor die and a second semiconductor die over the substrate after the forming of the conductive posts;
forming a first molding surrounding the first semiconductor die, the second semiconductor die and the conductive posts;
forming a conductive structure having a middle region between the first semiconductor die and the second semiconductive die, wherein the conductive structure comprises a first conductive trace coupled to one of the conductive posts and a second conductive trace in the middle region and separated from the conductive posts, wherein at least one of the first conductive trace and the second conductive trace is in contact with the semiconductor die;
disposing an electronic component over the first semiconductor die, the second semiconductor die, a portion of the first conductive trace, the second conductive trace, and the first molding;
disposing a second molding over the conductive structure, wherein the second molding surrounds and in contact with sidewalls of the electronic component; and
removing the substrate.

17. The method of claim 16, wherein the first molding is in contact with the first semiconductor die, the second semiconductor die and the conductive posts.

18. The method of claim 16, further comprising performing a multi-staged cleaving operation to singulate an integrated semiconductor package.

19. The method of claim 16, further comprising forming an electric magnetic interference (EMI) shield covering a top surface and a sidewall of the second molding and a sidewall of the first molding.

20. The method of claim 19, wherein the EMI shield is coupled to a ground terminal through the first conductive trace and one of the conductive posts.

* * * * *